(12) United States Patent
Hongo et al.

(10) Patent No.: US 6,372,084 B2
(45) Date of Patent: Apr. 16, 2002

(54) PLASMA PROCESSING APPARATUS WITH A DIELECTRIC PLATE HAVING A THICKNESS BASED ON A WAVELENGTH OF A MICROWAVE INTRODUCED INTO A PROCESS CHAMBER THROUGH THE DIELECTRIC PLATE

(75) Inventors: Toshiaki Hongo, Amagasaki; Tetsu Osawa, Kanagawa, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/815,304

(22) Filed: Mar. 23, 2001

(30) Foreign Application Priority Data

Mar. 24, 2000 (JP) ........................................ 2000-085264

(51) Int. Cl.$^7$ .............................................. H01L 21/00
(52) U.S. Cl. ............................... 156/345; 118/723 MW; 118/723 ME
(58) Field of Search .................. 156/345; 118/723 MW, 118/723 ME, 723 MR; 204/298.38

(56) References Cited

U.S. PATENT DOCUMENTS

6,321,681 B1 * 11/2001 Colpo et al. ................ 156/345

* cited by examiner

Primary Examiner—Thi Dang
(74) Attorney, Agent, or Firm—Pillsbury Winthrop LLP

(57) ABSTRACT

A plasma processing apparatus applies a high-quality process to an object to be processed by preventing impurities from being generated due to a microwave transmitting through a dielectric plate. The dielectric plate is provided between a process chamber of a plasma processing apparatus and a slot electrode guiding a microwave used for a plasma process. A thickness H of the dielectric plate has a predetermined relationship with a wavelength $\lambda$ of the microwave in the dielectric plate so that an amount of isolation of the dielectric plate due to transmission of the microwave is minimized. The wavelength $\lambda$ is represented by $\lambda = \lambda_0 n$, where $\lambda_0$ is a wavelength of the microwave in a vacuum and n is a wavelength reducing rate of the dielectric plate represented by $n = 1/(\epsilon_r)^{1/2}$, where $\epsilon_r$ is a specific dielectric rate of the dielectric plate in a vacuum.

10 Claims, 17 Drawing Sheets

200b

PLASMA PROCESSING APPARATUS WITH A DIELECTRIC PLATE HAVING A THICKNESS BASED ON A WAVELENGTH OF A MICROWAVE INTRODUCED INTO A PROCESS CHAMBER THROUGH THE DIELECTRIC PLATE

BACKGROUND OF THE INVENTION

1. Field of the Invention

The present invention relates to plasma processing apparatuses and, more particularly, to a plasma processing apparatus having a dielectric plate through which a microwave is introduced into a process chamber so as to generate plasma in the process chamber.

2. Description of the Related Art

In recent years, a plasma processing apparatus is used to perform a film deposition process, an etching process or an ashing process in a manufacturing process of semiconductor devices since the semiconductor devices have become more densified and a finer structure. For example, in a typical microwave plasma processing apparatus, a 2.45 GHz microwave is introduced into a process chamber through a slot electrode. An object to be processed such as a semiconductor wafer or an LCD substrate is placed inside the process chamber, which is maintained under a negative pressure environment by a vacuum pump. Additionally, a reactant gas is also introduced into the process chamber so that the process gas is converted into plasma by the microwave. Thus, active radicals and ions are generated, and the radicals and ions react with the object to be processed, which achieves a film deposition process or an etching process.

Generally, the microwave is introduced into the process chamber from a slot electrode by being passed through a dielectric plate. The dielectric plate serves as a top plate of the process chamber so as to hermetically seal the process chamber. The dielectric plate must be made of a dielectric or insulating material so as to let the microwave passes therethrough.

Since the microwave has a nature of wave propagation, a standing wave is generated as a resultant wave of a synthesis of a progressing wave traveling along the front surface of the dielectric plate and a regressive wave reflected by the back surface of the dielectric plate. Conventionally, the thickness of the dielectric plate is determined so that a transmission rate of the microwave with respect of the dielectric plate is maximized.

However, the inventor of the present invention found that the dielectric material of the dielectric plate isolates by a plasma ion energy applied by transmission of a microwave isolates the material of the dielectric plate. If the material of the dielectric plate isolates, the material enters the object to be processed as impurities. On the other hand, if the transmission rate of the microwave with respect to the dielectric plate is reduced so as to prevent the isolation of the material of the dielectric plate, a plasma processing speed is reduced which results in deterioration of a yield rate.

SUMMARY OF THE INVENTION

It is a general object of the present invention to provide an improved and useful plasma processing apparatus in which the above-mentioned problems are eliminated.

A more specific object of the present invention is to provide a plasma processing apparatus which can apply a high-quality process to an object to be processed by preventing impurities from being generated due to a microwave transmitting through a dielectric plate.

In order to achieve the above-mentioned objects, there is provided according to one aspect of the present invention a dielectric plate adapted to be provided between a process chamber of a plasma processing apparatus and a slot electrode guiding a microwave used for a plasma process, wherein a thickness H of the dielectric plate has a predetermined relationship with a wavelength $\lambda$ of the microwave in the dielectric plate so that an amount of isolation of the dielectric plate due to transmission of the microwave is minimized, the wavelength $\lambda$ being represented by $\lambda=\lambda_0 n$, where $\lambda_0$ is a wavelength of the microwave in a vacuum and n is a wavelength reducing rate of the dielectric plate represented by $n=1/(\epsilon_r)^{1/2}$, where $\epsilon_r$ is a specific dielectric rate of the dielectric plate in a vacuum.

According to the present invention, the thickness H of the dielectric plate is determined based on the relationship with the wavelength $\lambda$ of the microwave in the dielectric plate. When the thickness H of the dielectric plate is 0.5 times the wavelength $\lambda$ of the microwave in the dielectric plate, a standing wave is generated as a resultant wave of a synthesis of a progressing wave traveling along the front surface of the dielectric plate and a regressive wave reflected by the back surface of the dielectric plate. Thereby, the reflection is maximized and a power of the microwave transmitted to the process chamber 102 is minimized. In such a case, generation of plasma is insufficient, and, thereby a desired process speed cannot be achieved.

On the other hand, when thickness of the dielectric plate is 0.75 times the wavelength $\lambda$ of the microwave in the dielectric plate, the transmission power of the microwave is maximized but ion energy in the plasma is also maximized. A plasma ion energy applied by transmission of a microwave isolates the material of the dielectric plate. If the material of the dielectric plate isolates, the material enters the object to be processed as impurities, thereby deteriorating a high-quality plasma process.

In order to supply a microwave having a sufficient power but prevent the dielectric plate from being isolated, the predetermined relationship between the thickness H and the wavelength $\lambda$ of the dielectric plate is preferably represented by $0.5\lambda<H<0.75\lambda$. More preferably, the thickness H of the dielectric plate satisfies a relationship represented by $0.6\lambda \leq H \leq 0.7\lambda$.

Alternatively, the predetermined relationship between the thickness H and the wavelength $\lambda$ of the dielectric plate may be represented by $0.3\lambda<H<0.4\lambda$.

In general, the predetermined relationship between the thickness H and the wavelength $\lambda$ of the dielectric plate is represented by one of the relationships $(0.1+0.5\ N)\lambda \leq H \leq (0.2+0.5\ N)\lambda$ and $(0.3+0.5\ N)\lambda \leq H \leq (0.4+0.5\ N)\lambda$, where N is an integer.

Additionally, there is provided according to another aspect of the present invention a plasma processing apparatus comprising: a process chamber in which a plasma process is applied to an object to be processed; a slot electrode having a plurality of slits guiding a microwave introduced into the process chamber so as to generate plasma in the process chamber; and a dielectric plate provided between the slot electrode and the process chamber, wherein a thickness H of the dielectric plate has a predetermined relationship with a avelength $\lambda$ of the microwave in the dielectric plate so that an amount of isolation of the dielectric plate due to transmission of the microwave is minimized, the wavelength $\lambda$ being represented by $\lambda=\lambda_0 n$, where $\lambda_0$ is a wavelength of the microwave in a vacuum and n is a wavelength reducing rate of the dielectric plate represented by $n=1/(\epsilon_r)^{1/2}$, where $\epsilon_r$ is a specific dielectric rate of the dielectric plate in a vacuum.

Other objects, features and advantages of the present invention will become more apparent from the following detailed description when read in conjunction of the accompanying drawings.

DETAILED DESCRIPTION OF THE PREFERRED EMBODIMENTS

Figure 1:
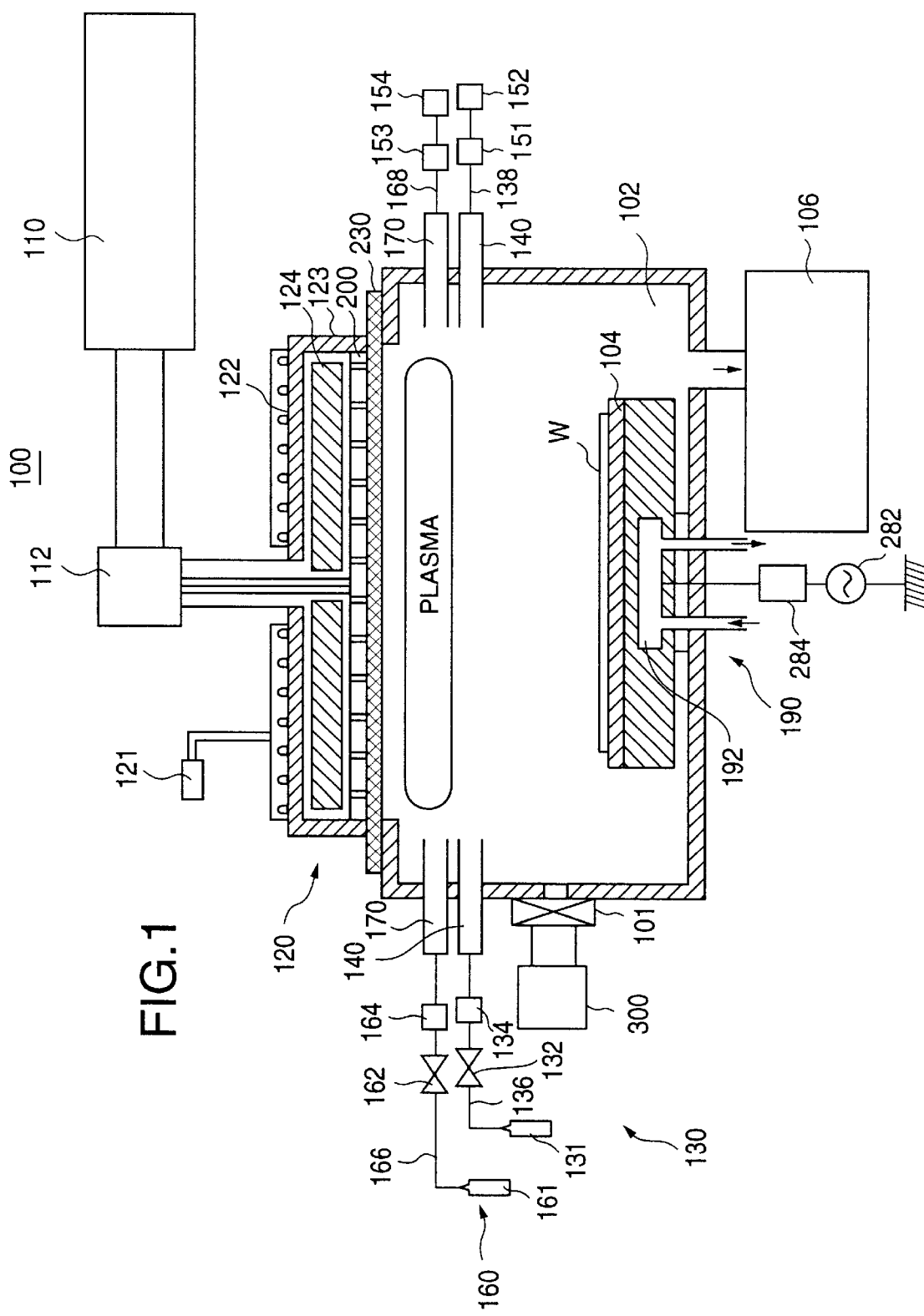
FIG. 1 is an illustration of a structure of a microwave plasma processing apparatus according an embodiment of the present invention.

A description will now be given, with reference to FIG. 1, of an embodiment of the present invention. FIG. 1 is an illustration of a structure of a microwave plasma processing apparatus 100 according to the embodiment of the present invention. The present invention is specifically related to a dielectric plate through which a microwave is introduced into a process chamber. A feature of the dielectric plate is described with reference to FIGS. 11 to 13.

The microwave plasma processing apparatus 100 shown in FIG. 1 comprises: a gate valve 101 connected to a cluster tool 300 (refer to FIG. 19); a process chamber 102 which can accommodate a susceptor 104 on which an object to be processed such as a semiconductor wafer or an LCD substrate; a high-vacuum pump 106 connected to the process chamber 102; a microwave supply source 110; an antenna member 120; and gas supply systems 130 and 160. It should be noted that a control system of the plasma processing apparatus 100 is not illustrated in FIG. 1 for the sake of simplification.

The process chamber 102 is made of a conductive material such as an aluminum alloy. In the present embodiment, the process chamber 102 has a generally cylindrical shape. However the shape of the process chamber 102 is not limited to the cylindrical shape, and any shape can be adopted unless the process chamber 102 is deformed by a vacuum formed in the process chamber 102. The susceptor 104 is provided in the process chamber 102 so as to support the object W to be processed. It should be noted that an electrostatic chuck or a clamping mechanism to fix the object W on the susceptor 104 is not illustrated in FIG. 1 for the sake of simplification.

Figure 2:
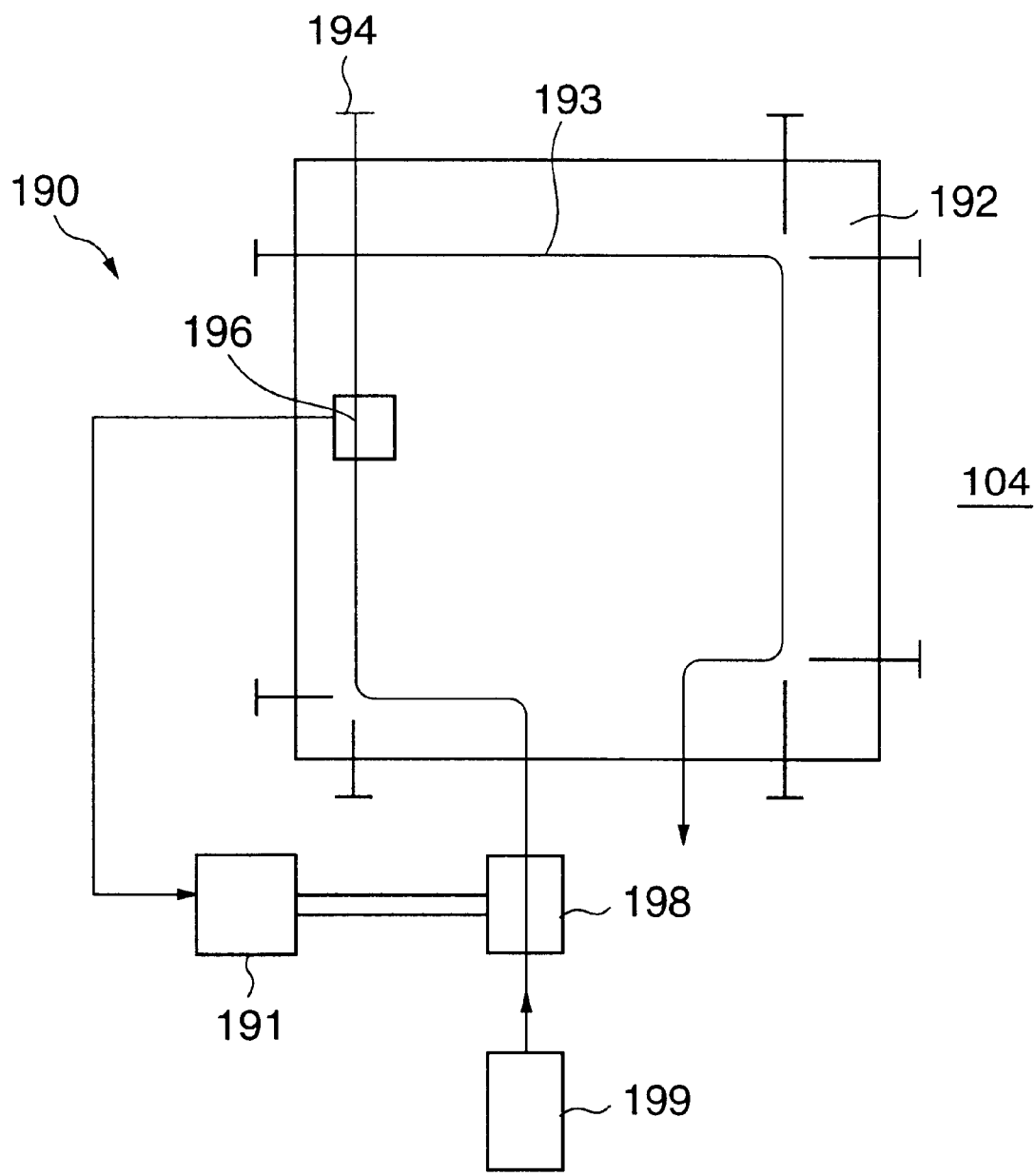
FIG. 2 is a block diagram of a temperature-adjusting device shown in FIG. 1.

The susceptor 104 controls a temperature of the object W to be processed in the process chamber 102. The temperature of the susceptor 104 is adjusted to a value within a predetermined temperature range by a temperature-adjusting device 190. FIG. 2 is a block diagram of the temperature-adjusting device 190 shown in FIG. 1. The temperature-adjusting device 190 comprises, as shown in FIG. 2, a control unit 191, a cooling jacket 192, a sealing member 194, a temperature sensor 196 and a heater unit 198. Cooling water is supplied to the temperature control device 190 from a water source 199 such as a water line. The control unit 191 controls the temperature of the object W to fall within a predetermined temperature range. In order to achieve an easy control, it is preferable that the temperature of the cooling water supplied by the water source 199 is constant.

For example, in a case in which a silicon nitride film ($Si_3N_4$) is to be formed on a silicon substrate as the object W (single layer nitride film), the control unit 191 controls the heater unit 198 so that the temperature of the silicon substrate falls within a range from about 450° C. to about 500° C. If the silicon substrate is not maintained at a temperature above 450° C., a dangling bond may occur which is not preferable since a threshold voltage may vary as described later.

A consideration will be given of a case in which a silicon nitride film is formed on a silicon oxidation film ($SiO_2$) after the silicon oxidation film is formed on the silicon substrate. In this case, an upper portion of the silicon oxidation film is converted into the silicon nitride film by a plasma process by introducing nitrogen into the silicon oxidation film. In such a process, the control unit 191 controls the heater unit 198 so that the temperature of the silicon substrate falls within a range from about 250° C. to about 350° C.

Figure 3:
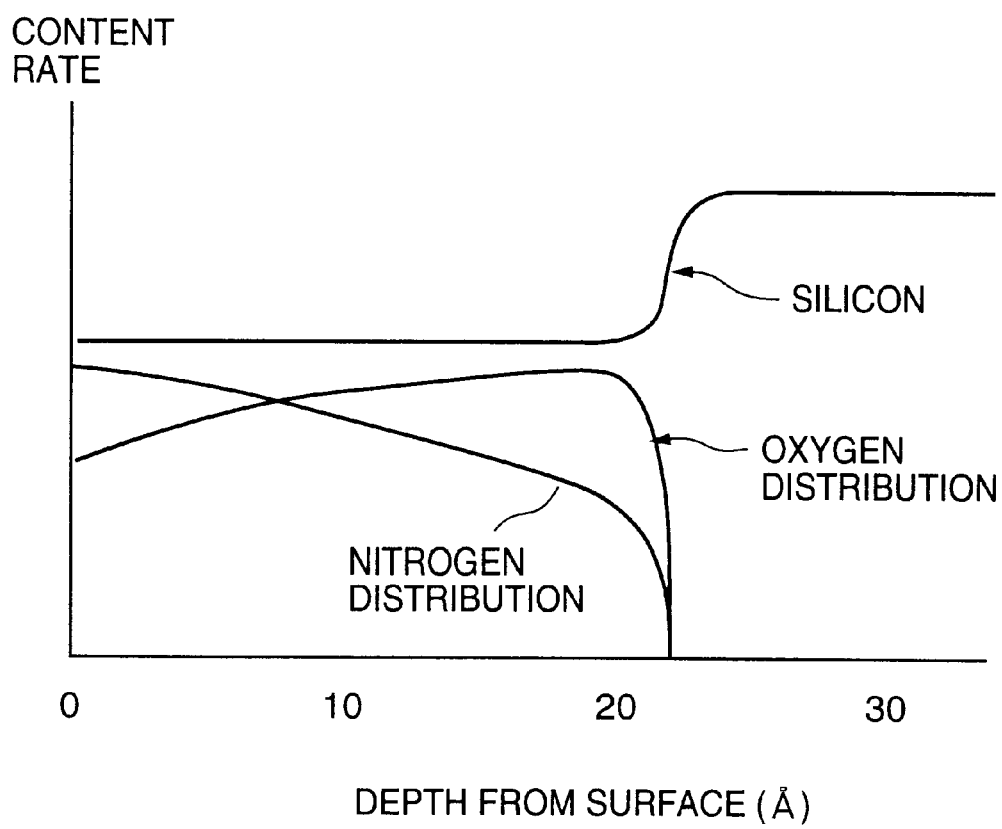
FIG. 3 is a graph showing a nitrogen distribution in a direction of a depth when a multi-layered structure is formed on an object to be processed at a high temperature.

The reason for setting the temperature of the silicon substrate below about 350° C. is explained below with reference to FIG. 3. FIG. 3 is a graph showing a nitrogen distribution in a direction of a depth when a multi-layered structure is formed on an object to be processed at a high temperature (for example, about 500° C.). As shown in FIG. 3, when the temperature of the silicon substrate is set to a value greater than 350° C. by controlling the heater 198, a large amount of nitrogen is introduced into an inner portion of the silicon oxidation film as well as a surface (an upper portion) of the silicon oxidation film. It can be appreciated from FIG. 3 that nitrogen reaches a position 20 Å distant from the surface of the silicon oxidation film.

In such a case, nitrogen reaches a boundary between the silicon substrate and the silicon oxidation film, and a compound of silicon, oxygen and nitrogen is formed. The formation of the compound is not p referable since the compound may deteriorate a performance of a semiconductor element formed on the silicon sub strate. A rate of nitrogen reaching the boundary between the silicon oxidation film and the silicon substrate depends on the size of the semiconductor element. If a gate length is in the range of 0.18 μm to 0.3 μm as in the conventional semiconductor element, an influence of the nitrogen may be negligible. However, recent semiconductor element is reduced in its size and thus the gate length is reduced to, for example, 0.13 μm or 0.10 μm. Thus, the influence of the nitrogen will not be negligible.

Figure 4:
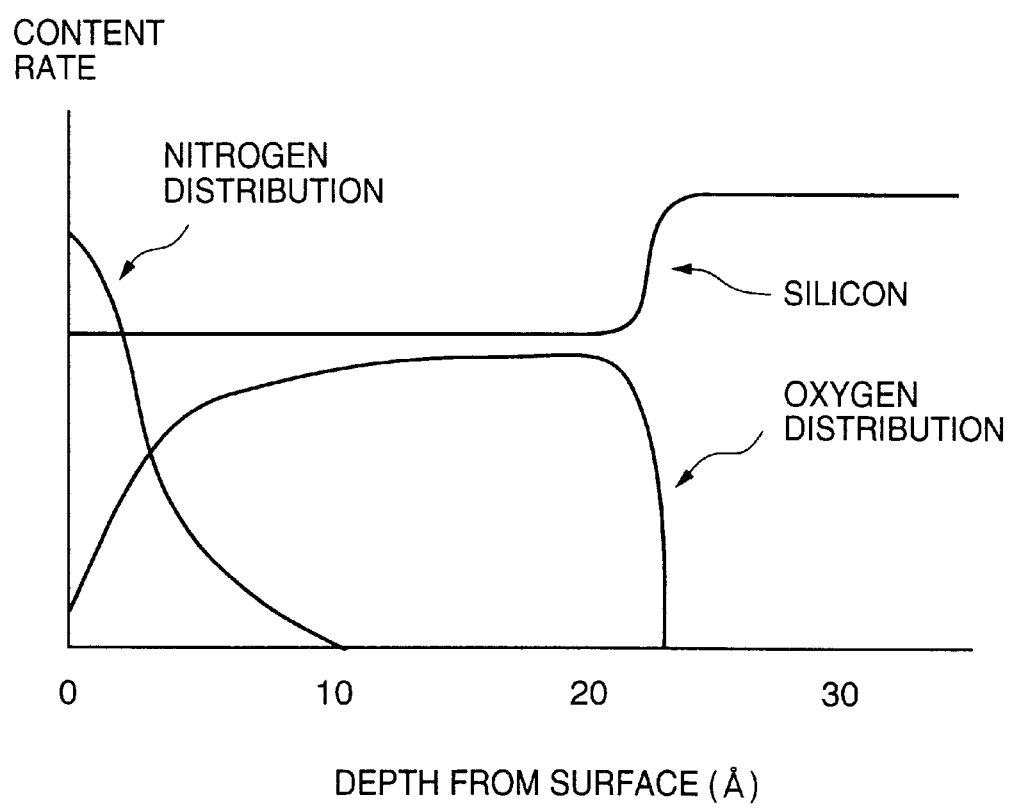
FIG. 4 is a graph showing a nitrogen distribution in a direction of a depth when a multi-layered structure is formed on an object to be processed at an appropriate temperature.

On the other hand, if the temperature of the silicon substrate controlled by the heater unit 198 is set to below 350° C., the nitrogen is distributed to an inner portion of the silicon oxidation film as well as the surface (an upper portion) of the silicon oxidation film. FIG. 4 is a graph showing a nitrogen distribution in a direction of a depth when a multi-layered structure is formed on an object to be processed at an appropriate temperature (for example, about 350° C.). It can be appreciated from FIG. 4 that the depth of the nitrogen is within an allowable range (less than 10Å), and, therefore, the above-mentioned problem can be eliminated by setting the temperature of the silicon substrate below 350° C.

Figure 5:
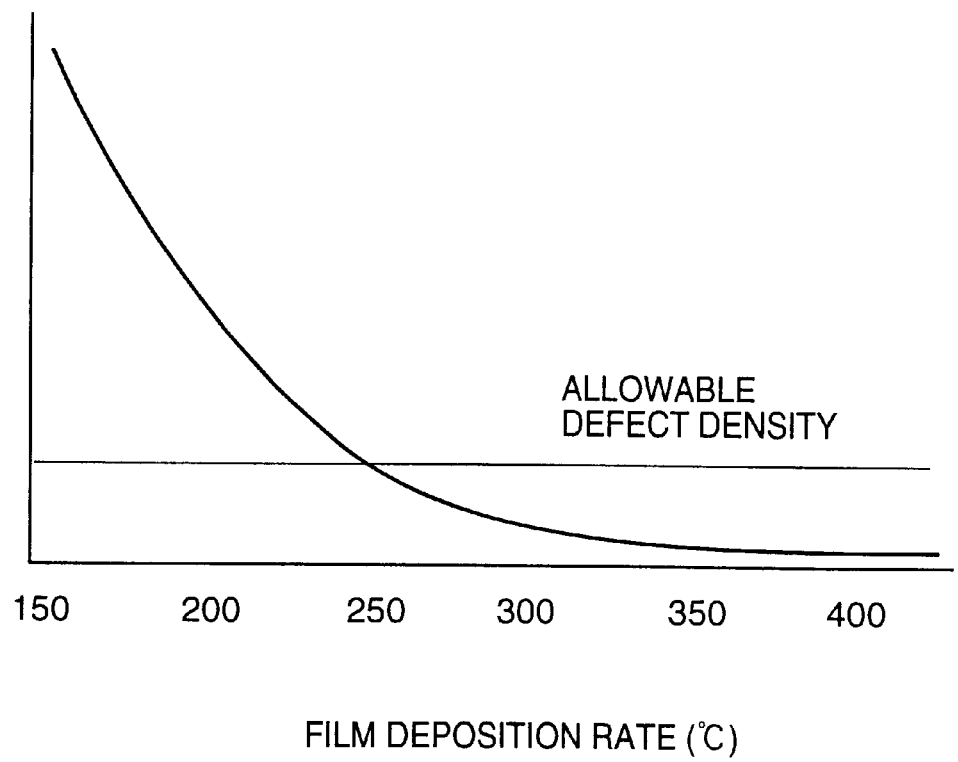
FIG. 5 is a graph showing a relationship between a defect density and a temperature of a silicon nitride film.

The reason for setting the temperature of the susceptor 104 greater than about 250° C. is explained below. A CV characteristic which indicates a relationship between a gate voltage V and a gate capacitance C is often used as an index representing an operational characteristic of the object W to be processed (semiconductor element). The CV characteristic has a hysteresis at a time when the gate voltage V is applied and released. If the hysteresis width is large, threshold voltages (voltage at which a semiconductor element turns on and off) of the gate voltage V is varied, which deteriorates a reliability. Accordingly, the hysteresis width is preferably maintained within a predetermined voltage range such as less than 0.02 V. This may be applied to a layered structure. The hysteresis width becomes larger as the number of defects (dangling bond) of the silicon nitride film increases. FIG. 5 is a graph showing a relationship between defect density of the silicon nitride film and the temperature of the susceptor 104. In FIG. 5, a dotted line indicates an allowable defect density. In order to maintain the hysteresis width, the defect density of the silicon nitride film must be maintained as indicated by a dotted line in FIG. 5. The inventors found that the allowable defect density is about 250° C. as interpreted from FIG. 5.

The control unit 191 controls the temperature of the susceptor 104 to be about 450° C. for a CVD process and about at least 80° C. for an etching process. In any case, the object W to be processed is maintained at a temperature at which a water component does not adhere to the object W.

The cooling jacket 192 is provided for supplying a cooling water so as to cool the object W to be processed during a plasma process. The cooling jacket 192 is made of a selected material such as a stainless steel which has a high heat conductivity and an easy machinability to form a water passage 193. The water passage 193 extends in longitudinal and transverse directions of the cooling jacket 192 having a square shape, and the sealig members 194 are screwed into openings of the water passage 193. However, the shape of the cooling jacket 192 i not limited to the square shape, and the cooling jacket 192 and the water passage can be formed with any shape. It should be noted that a coolant such as alcohol, gulden or fluorocarbon may be used instead of the cooling water. The temperature sensor 196 can be a known sensor such as a PTC thermister an infrared sensor or a thermocouple. The temperature sensor may either be connected or not connected to the water passage 193.

The heater unit 198 is comprised of a heater wire wound on a water pipe connected to the water passage of the cooling jacket 192. By controlling an electric current supplied to the heater wire, the temperature of the cooling water flowing through the water passage 193 of the cooling jacket 192 can be adjusted. Since the cooling jacket 192 has high heat conductivity, the temperature of the cooling jacket is substantially equal to the temperature of the cooling water flowing through the water passage 193.

The susceptor 104 is movable in a vertical direction inside the process chamber. A vertically moving system of the susceptor 104 comprises a vertically moving member, a bellows and a vertically moving mechanism. The vertically moving system can be achieved by any known structure in this art. The susceptor 104 is moved up and down between a home position and a process position. When the plasma processing apparatus 100 is not in operation or a waiting state, the susceptor 104 is located at the home position. The object W to be processed is transferred to the susceptor 104 at the home position from the cluster tool 300 via the gate valve 101, and vice versa. A transfer position other than the home position may be defined so as to communicate with the gate valve 101. A vertical travel of the susceptor 104 can be controlled by a controller of the vertically moving mechanism or a control unit of the plasma processing apparatus 100, and the susceptor can be observed through a view port (not shown in the figure) provided to the process chamber 102.

The susceptor 104 is connected to a lifter pin vertically moving system (not shown in the figure). The lifer pin vertically moving system comprises a vertically moving member, a bellows and a vertically moving device. The vertically moving system can be achieved by any known structure in this art. The vertically moving member is made of aluminum, for example, and is connected to three lifer pins, which vertically extend from vertices of an equilateral triangle. The lifter pins are vertically movable by penetrating the susceptor 104 so as to vertically move the object W to be processed placed on the susceptor 104. The object W is moved in the vertical direction at a time when the object W is put into the process chamber 102 from the cluster tool 300, and at a time when the object W after processing is taken out of the process chamber 102 and transferred to the cluster tool 300. The vertically moving mechanism may be arranged to allow the vertical movement of the lifter pins alone when the susceptor 104 is at a predetermined position such as the home position. Additionally, a vertical travel of the lifter pins can be controlled by a controller of the vertically moving mechanism or a control unit of the plasma processing apparatus 100, and the movement of the lifter pins can be observed through a view port (not shown in the figure) provided to the process chamber 102.

A baffle plate may be provided to the susceptor 104 if necessary. The baffle plate may be vertically moveable together with the susceptor 104, or may be brought in engagement with the susceptor 104 at the process position. The baffle plate separates a process space in which the object W to be processed is placed from an exhaust space underneath the process space. The baffle plate mainly serves to maintain a potential of the process space (that is, maintain a microwave in the process space) and maintain a predetermined degree of vacuum (for example, 50 mTorr). The baffle plate is formed of pure aluminum, and has a hollow disk-like shape. The baffle plate has a thickness of 2 mm, and has many through holes arranged at random. Each of the through holes has a diameter of about 2 mm so that an open area ratio of the baffle plate is more than 50%. It should be noted that the baffle plate could have a meshed structure. Additionally, the baffle late may have a function to prevent a reverse flow from the exhaust space to the process space or a function to create a pressure difference between the process space and the exhaust space.

The susceptor 104 is connected to a bias radio frequency power supply 282 and a matching box (matching circuit) 284, and constitutes an ion-plating device together with an antenna member 120. The bias radio frequency power source 282 applies a negative direct current bias (for example, a 13.5 MHz radio frequency) to the object W to be processed. The matching box 284 is provided to eliminate influences of a stray capacitance and a stray inductance of an electrode in the process chamber 102. The matching box, for example, uses a variable condenser arranged parallel and serial to a load. As a result, ions are accelerated by the bias voltage toward the object W to be processed, resulting in promotion of the process by ions. The energy of the ions is determined by the bias voltage, and the bias voltage can be controlled by the radio frequency power. The frequency of the radio frequency applied by the power source 283 is adjustable in response to slits 210 of a slot electrode 200.

The inside of the process chamber 102 is maintained at a predetermined negative pressure by a high-vacuum pump 106. The high-vacuum pump 106 uniformly evacuate gas from the process chamber 102 so as to maintain the plasma density uniform so that the plasma is prevented from being locally concentrated to prevent a local change in a depth of a processed portion of the object W. Although the high-vacuum pump 106 is provided at a corner of a bottom of the process chamber 102 in FIG. 1, a plurality of high-vacuum pumps may be provided to the process chamber 102, and the position of the high-vacuum pump 106 is not limited to the position indicated in FIG. 1. The high-vacuum pump 106 is constituted, for example, by a turbo-molecular pump (TMP), and is connected to the process chamber 102 via a pressure adjust valve (not shown in the figure). The pressure adjust valve is a known valve such as a so-called conductance valve, gate valve or high-vacuum valve. The pressure adjust valve is closed when the apparatus 100 is not in operation, and is open in operation so as to maintain the process chamber 102 at a predetermined pressure (for example, 0.1 to 10 mTorr) created by the high-vacuum pump 106.

It should be noted that, in the present embodiment shown in FIG. 1, the high-vacuum pump 106 is directly connected to the process chamber. The term "directly connected" means that the high-vacuum pump is connected to the process chamber without a connecting member between the high-vacuum pump 106 and the process chamber 102. However, a pressure adjust valve can be provided between the high-vacuum pump 106 and the process chamber 102.

Gas supply rings 140 and 170 made of quartz pipes are provided to a sidewall of the process chamber 102. The gas supply ring 140 is connected to a reactant gas supply system 130. The gas supply ring 170 is connected to a discharge gas supply system 170. The gas supply system 130 comprises a gas supply source 131, a valve 132, a mass flow controller 134 and a gas supply line 136 interconnecting the aforementioned parts. Similarly, the gas supply system 140 comprises a gas supply source 161, a valve 162, a mass flow controller 164 and a gas supply line 166 interconnecting the aforementioned parts.

For example, in order to deposit a silicon nitride film, the gas supply source 131 supplies a reactant gas (or material gas) such as $NH_3$ or $SiH_4$, and the gas supply source supplies a discharge gas such as a mixture gas produced by adding $N_2$ and $H_2$ to at least one of neon, xenon, argon, helium, radon and krypton. However, the gas supplied to the process chamber 102 is not limited to the above-mentioned gasses, and $Cl_2$, HCl, HF, $BF_3$, $SiF_3$, $GeH_3$, $ASH_3$, $PH_3$, $C_2H_2$, $C_3H_8$, $SF_6$, $Cl_2$, $CCl_2F_2$, $CF_4$, $H_2S$, $CCl_4$, $BCl_3$, $PCl_3$ or $SiCl_4CO$ may be supplied.

The gas supply system 160 may be omitted by replacing the gas supply source 131 with a gas supply source, which can supply a mixture gases supplied by the gas supply sources 131 and 161. The valves 132 and 162 are open during a plasma processing period of the object W to be processed, and is closed during a period other than the plasma processing period.

Each of the mass flow controllers 134 and 164 comprises a bridge circuit, an amplifying circuit, a comparator circuit and a flow control valve, and controls a gas flow. That is, each of the mass flow controllers 134 and 164 controls the flow control valve based on a measurement of flow by detecting a transfer of heat from upstream to downstream due to the gas flow. However, any known structure other than the above-mentioned structure may be used for the mass flow controllers 134 and 164.

Each of the gas supply passages 136 and 166 is formed of a seamless pipe and a bite type coupling or a gasket coupling is used so that impurities are prevented from entering the system through the gas supply passages 136 and 166. Additionally, in order to prevent generation of particles due to dirt or corrosion inside the pipes, the gas supply passages 136 and 166 may be coated by an insulating material such as PTFE, PFA, polyimide or PBI. Additionally, an electropolishing may be applied to an inner surface of the pipes forming the gas supply lines 136 and 166. Further, a dust particle trap filter may be provided to the gas supply lines 136 and 166.

Figure 6A:
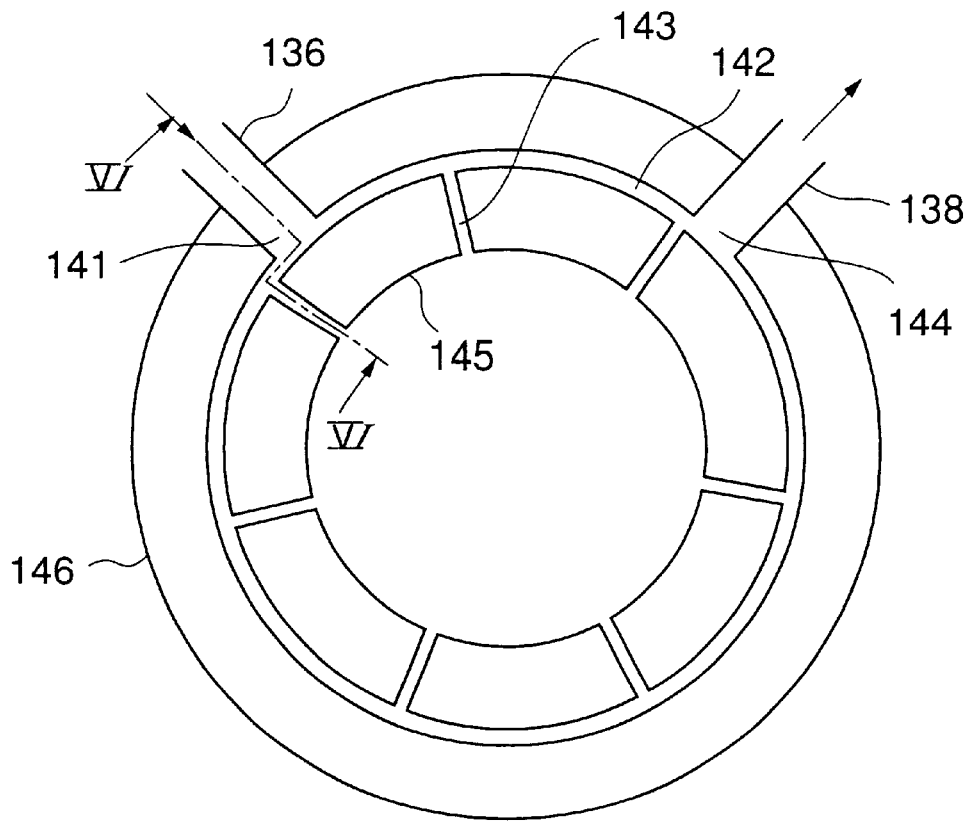
FIG. 6A is a plan view of a gas supply ring shown in FIG. 1.
Figure 6B:
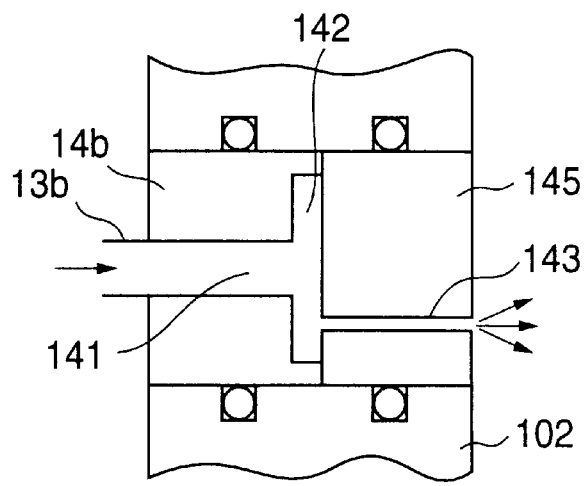
FIG. 6B is a cross-sectional view taken along a line VI—VI of FIG. 6A.
Figure 7:
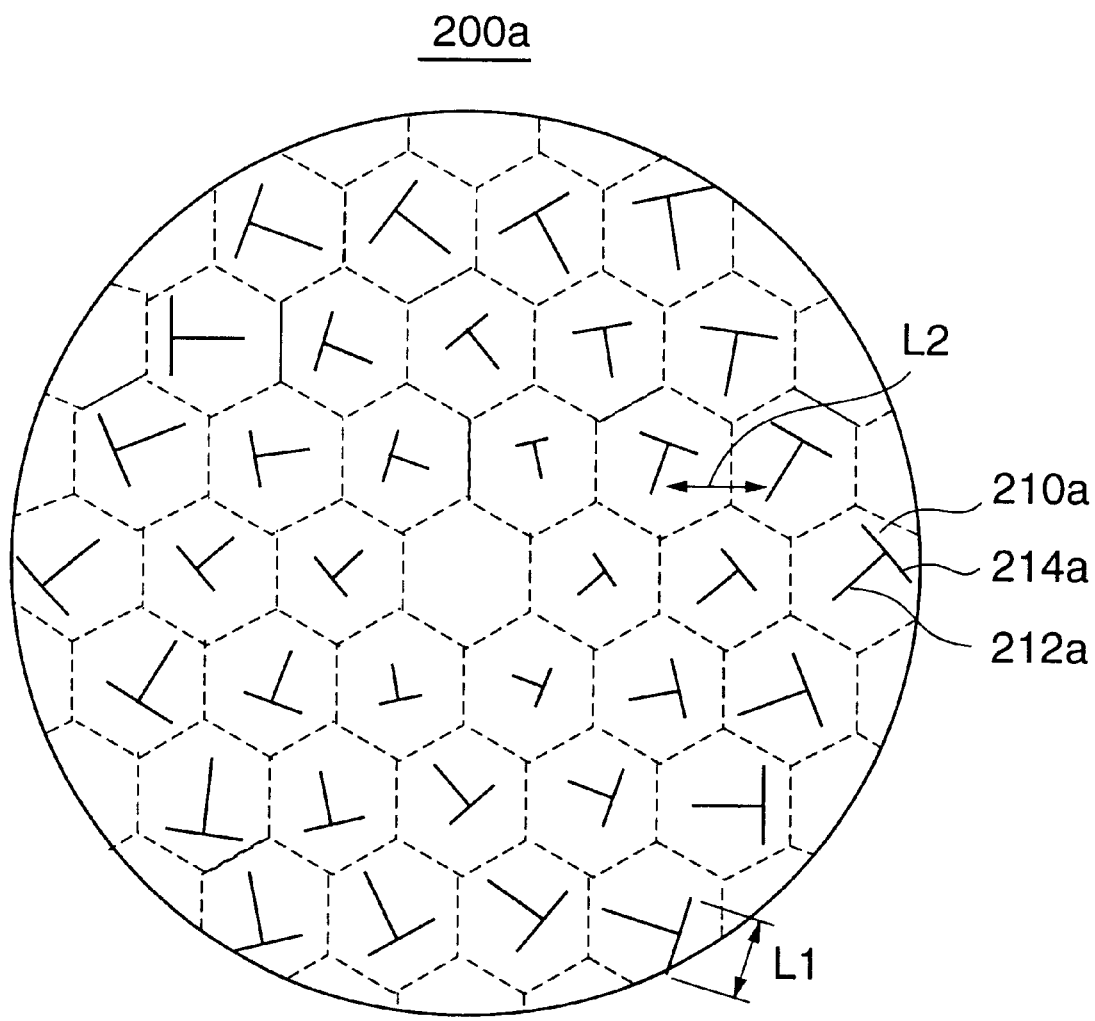
FIG. 7 is a plan view of an example of a slot antenna shown in FIG. 1.
Figure 8:
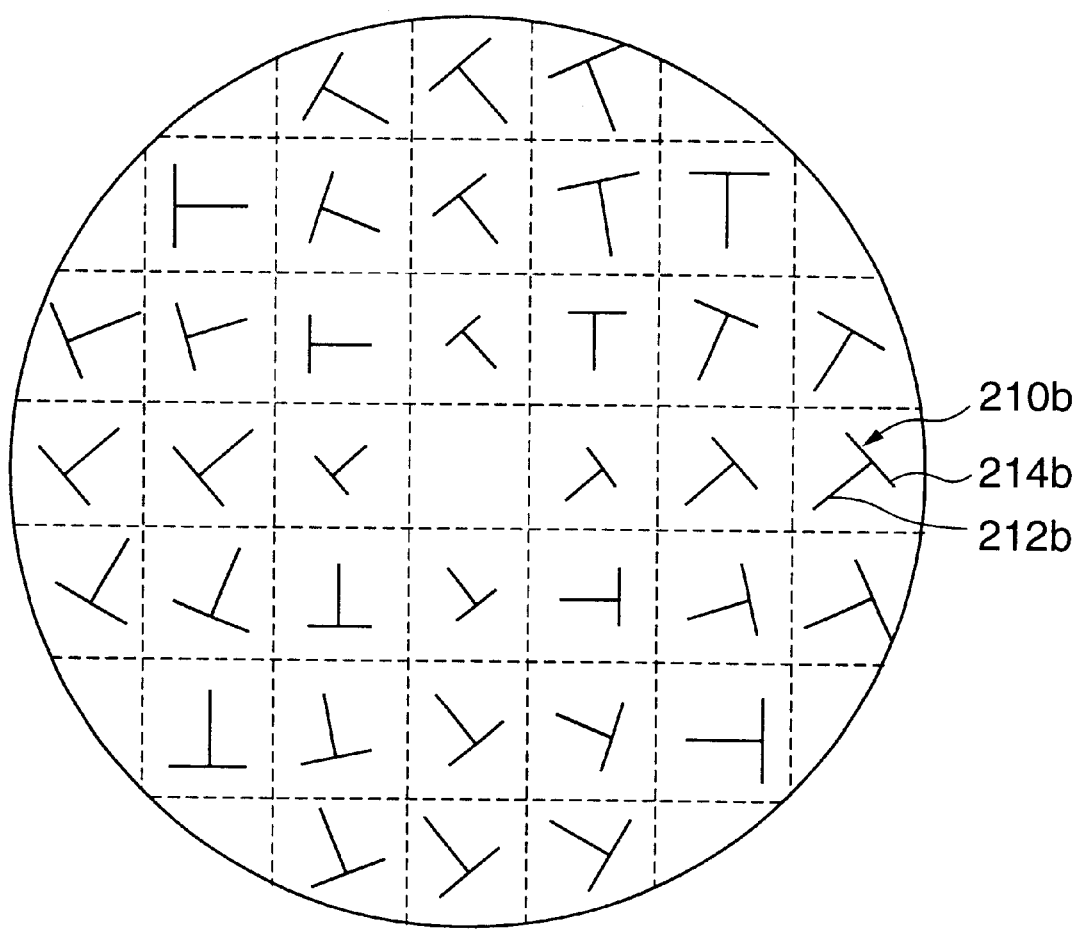
FIG. 8 is a plan view of another example of the slot antenna shown in FIG. 1.
Figure 9:
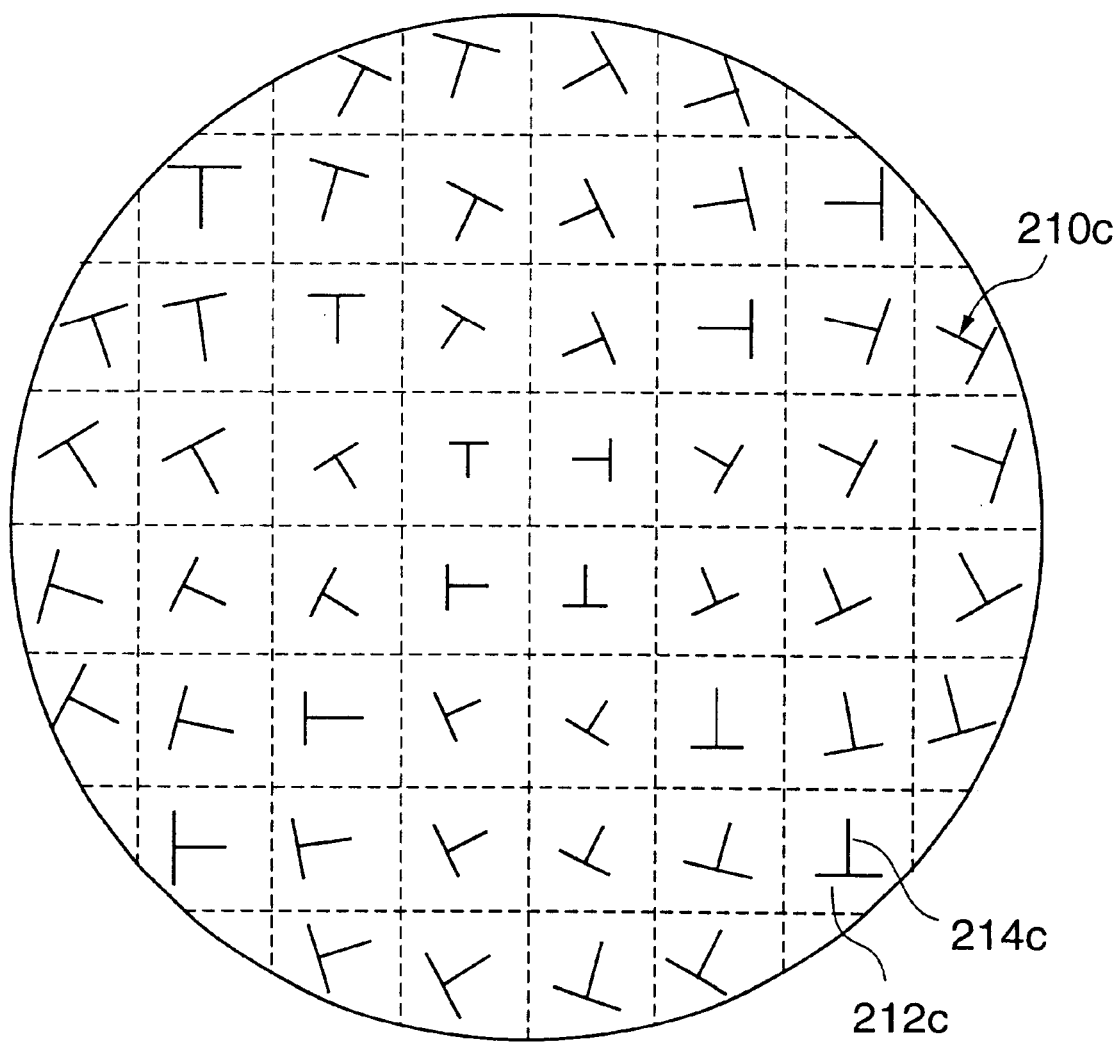
FIG. 9 is a plan view of a further example of the slot antenna shown in FIG. 1.

FIG. 6A is a plan view of a gas supply ring 140, and FIG. 6B is a cross-sectional view taken along a line VI—VI of FIG. 6A. As shown in FIGS. 6A and 6B, the gas supply ring 140 comprises: a ring-like housing or main part 146 which is made of quartz and attached to the sidewall of the process chamber 102; an inlet port 141 connected to the gas supply passage 136; an annular gas passage 142 connected to the inlet port 141; a plurality of gas supply nozzles 143 connected to the gas passage 142; an outlet port 144 connected to the gas passage 142 and a gas exhaust passage 138; and a nozzle part 145 which is made of quartz and fixed to the sidewall of the process chamber 102.

The gas supply nozzles 143 arranged at an equal interval in a circumferential direction contribute to form an even gas flow within the process chamber 102. The gas introducing means is not limited the gas supply ring 140, and a radial flow type or a showerhead type may be applied as described later.

Gas inside the gas supply ring 140 can be evacuated trough the outlet port 144 connected to the gas exhaust passage 138. Since each of the gas supply nozzles has a diameter of about 0.1 mm, a water component remaining inside the gas supply ring 140 cannot be effectively removed by evacuating the gas by the high-vacuum pump 106 connected to the process chamber 102 thorough the gas supply nozzles. Accordingly, the gas supply ring 140 according to the present embodiment effectively remove the remainder such as a water component within the gas passage 142 and the gas supply nozzles 143 through the outlet port 144 having an opening diameter much greater than that of the gas supply nozzles 143.

Similar to the gas supply nozzles 143, the gas supply nozzles 173 are provided to the gas supply ring 170, which has the same structure as the gas supply ring 140. Accordingly, the gas supply ring 170 comprises a main part 176; an inlet port 171, an annular gas passage 172, a plurality of gas supply nozzles 173, an outlet port 174 and a nozzle part 175. Similar to the gas supply ring 140, gas inside the gas supply ring 170 can be evacuated trough the outlet port 174 connected to the gas exhaust passage 168. Since each of the gas supply nozzles has a diameter of about 0.1 mm, a water component remaining inside the gas supply ring 170 cannot be effectively removed by evacuating the gas by the high-vacuum pump 106 connected to the process chamber 102 thorough the gas supply nozzles. Accordingly, the gas supply ring 170 according to the present embodiment effectively remove the remainder such as a water component within the gas passage 172 and the gas supply nozzles 173 through the outlet port 174 having an opening diameter much greater than that of the gas supply nozzles 173.

In the present embodiment, a vacuum pump 152 is connected to the gas exhaust passage 138, which is connected to the outlet port 144 of the gas supply ring 140, via a pressure adjust valve 151. Similarly, a vacuum pump 154 is connected to the gas exhaust passage 168, which is connected to the outlet port 164 of the gas supply ring 170, via a pressure adjust valve 153. Each of the vacuum pumps 152 and 154 can a turbo-molecular pump, a sputter ion pump, a getter pump, a sorption pump or a cryopump.

The pressure adjust pumps 151 and 153 are closed when the respective valves 132 and 162 are open, and are opened when the respective valves 132 and 162 are closed. As a result, when a plasma process is performed by opening the valves 132 and 162, the vacuum pumps 152 and 154 are disconnected from the respective gas supply system by the pressure control valve 151 and 153 being closed so that the reactant gas and the discharge gas are introduced into the process chamber 102. The vacuum pumps 152 and 154 are connected to the gas supply system be the pressure adjust valves 151 and 153 being open after completion of the plasma process. That is, the vacuum pumps 152 and 154 can evacuate gas from the respective gas supply rings 140 and 170 during a period other than a period when the plasma process performed. Specifically, the vacuum pumps 152 and 154 can be operated during a period for carrying the object W into the process chamber or taking out of the process chamber 102 or a period for moving the susceptor 104. Accordingly, the vacuum pumps 152 and 154 can evacuate the remaining gas from the gas supply rings 140 and 170 to an extent that an influence of the remaining gas is negligible. Thereby, the gas supply nozzles 143 and 173 are prevented from being closed by impurities such as a water component remaining in the gas supply rings, thereby preventing an uneven introduction of the gas from the gas supply rings 140 and 170. Additionally, the object W to be processed is prevented from being contaminated by impurities discharged from the gas supply rings 140 and 170. Thus, the vacuum pumps 152 and 154 enables a high-quality plasma process being applied to the object W to be processed.

It should be noted that, instead of providing the vacuum pumps 152 and 154, the gas supply rings 140 and 170 may be directly connected to the high-vacuum pump 106 by bypass passages (not shown in the figure) that bypass the process chamber 102.

In the present embodiment, a microwave is generated by a microwave generator 110. The microwave generator 110 comprises a magnetron, which can generate, for example, a 2.45-GHz microwave (for example, 5 kW). The microwave generated by the microwave generator 110 is converted into a TM mode, a TE mode or a TEM mode by a mode converter 112. It should be noted that, in FIG. 1, an isolator for absorbing a microwave returning to the microwave generator 110 and a stub tuner for load matching are not shown for the sake of simplification of the figure.

The antenna member 120 comprises a temperature control plate 122, an antenna-accommodating member 123 and a dielectric plate 230. The temperature control plate 122 is connected to a temperature control unit 121. The antenna-accommodating member 123 accommodates a slow-wave member 124 and a slot electrode 200 which contacts the slow-wave member 124. The dielectric plate 230 is positioned under the slot electrode 200. The antenna-accommodating member 123 is made of a material having a high heat conductivity such as stainless steel. A temperature of the antenna accommodating member 123 can be controlled nearly equal to the temperature of the temperature control plate 122.

The slow-wave member 124 is made of a material having a predetermined permittivity to reduce the wavelength of the microwave transmitted therethrough. In order to make the plasma density in the process chamber 102 uniform, many slits must be formed in the slot electrode 200. Thus, the slow-wave member 124 has a unction to enable the formation of many slits in the slot electrode 200. Ceramics such as SiN or AlN can be used for the slow-wave member 124. For example, the specific permittivity $\epsilon_r$ of AlN is about 9 and, thus, the wavelength reducing rate n is 0.33 (n=1/($\epsilon_r$)$^{1/2}$=0.33). Accordingly, the transmission rate of the microwave after passing through the slow-wave member 124 becomes 0.33 times the original transmission rate, and, thus, the wavelength also becomes 0.33 times the original wavelength. Accordingly, a distance between adjacent slits 210 of the slot electrode 200 can be reduced, resulting in a larger number of slits 210 being provided in the slot electrode 200. The slot electrode 200 is formed of a copper plate having a circular shape whose diameter is, for example, about 50 cm and thickness is less than 1 mm. The slot electrode 200 is fixed to the slow-wave member 124 by screws.

The slot electrode 200 may be referred to as a radial inline slot antenna (RLSA) or an ultra high efficiency flat antenna. The present invention is not limited to such an antenna, and other type antenna such as a single layer waveguide flat antenna or a dielectric substrate parallel slot array may be used.

FIGS. 7, 8, 9 and 10 are plan views of examples of the slot antenna 200 shown in FIG. 1. Hereinafter, the reference numerals such as 200 generally represent all the reference numerals having a suffix such as 200a, 200b, 200c and 200d. Any one of the slot electrodes 200a, 200b, 200c and 200d can be used in the plasma processing apparatus 100 shown in FIG. 1.

Figure 10:
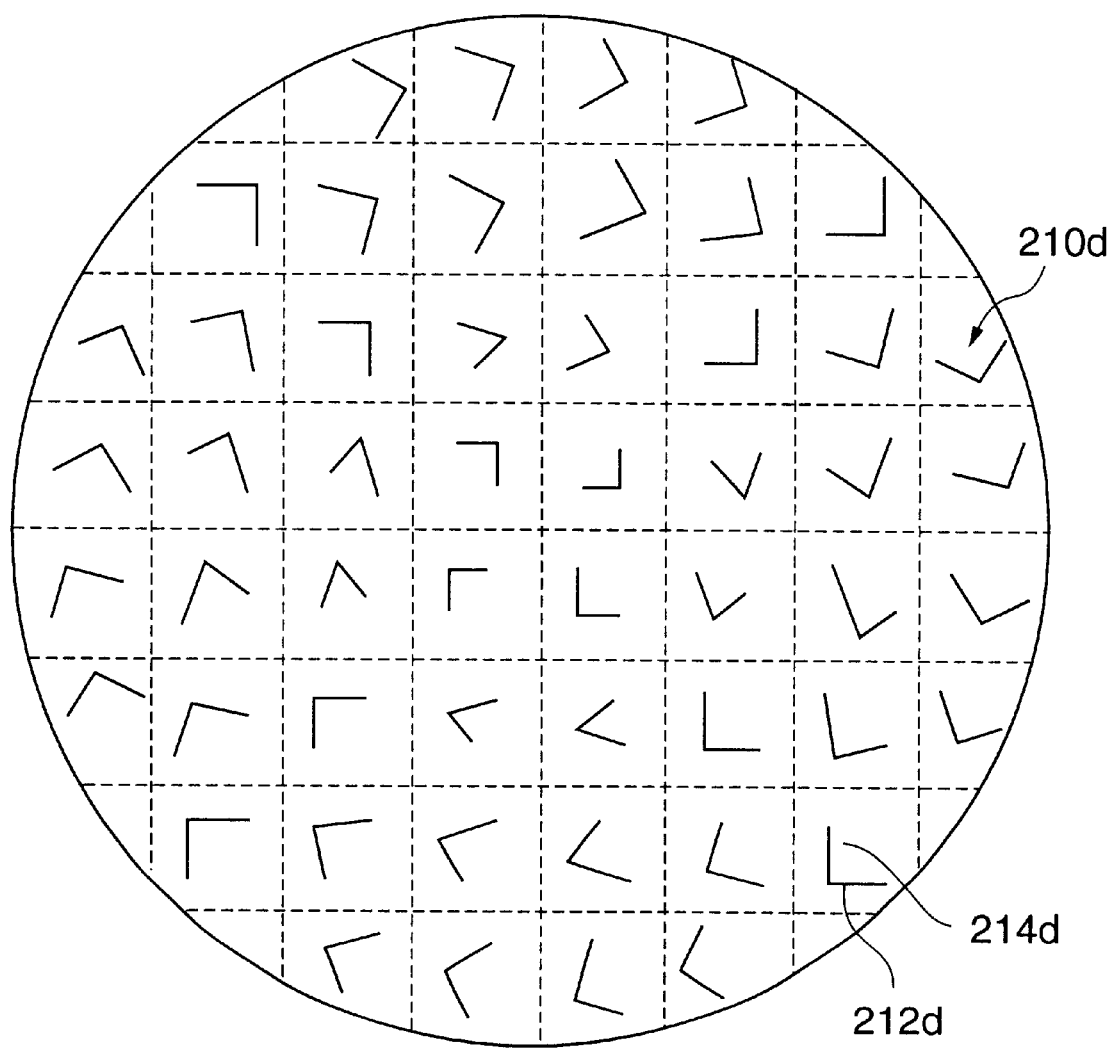
FIG. 10 is a plan view of another example of the slot antenna shown in FIG. 1.

The slot electrode 200 has a plurality of T-slits 210 consisting of a pairs of slits 212 and 214 arranged in a T-shape with a predetermined distance therebetween. The T-slits 210 are arranged in a plurality of areas or sections defined by virtually dividing the surface of the slot electrode 200 on a one-to-one basis. In the slot electrode 200a shown in FIG. 7, each of the virtually divided areas has a hexagonal shape. In the slot electrodes 200b, 200c and 200d shown in FIGS. 8, 9 and 10, each of the virtually divided areas has a square shape. It should be noted that each of the T-slits 210d of the slot electrode 200d shown in FIG. 10 is a variation of the T-slit 210, and the actual shape formed by the slits 211d and 214d is similar to V-shape.

The T-slits 210 are arranged on the surface of the slot electrode 200 so that the density of the T-slits 210 is substantially uniform over the entire surface of the electrode 200. This is to prevent an isolation of the material forming the dielectric plate 230 so as to prevent the isolated material as impurities from being mixed to a reactant gas. Since the slot electrode 200 can provide a substantially uniform distribution of ion energy to the dielectric plate 230, the dielectric plate 230 is prevented from being isolated which results in a high-quality plasma process being achieved.

As mentioned above, each T-slit 210 comprises a pair of slits 212 and 214 forming a T-shape with a predetermined distance therebetween. More specifically, each of the slits 212 and 214 has a length L1 which is in the range of about one half of the wavelength $\lambda_0$ of the microwave to 2.5 times a free space wavelength. The width of each of the slits 212 and 214 is about 1 mm. A distance L2 between two adjacent pairs of slits along a radial direction is approximately equal to the wavelength $\lambda_0$. That is, the length L1 of each of the slits 212 and 214 is set to satisfy the following relationship.

$$(\lambda_0/2 \times 1/\sqrt{\epsilon_r}) \leq L1 \leq (\lambda_0 \times 2.5)$$

By setting each of the slits 212 and 214 to the above-mentioned structure, a uniformly distributed microwave can be achieved in the process chamber 102.

Each of the slits 212 and 214 is slanted with respect to a radial line connecting the center of the slot electrode 200 and an intersecting point between longitudinal axes of the slits 214 and 214. The size of the T-slits 210 becomes larger as a distance from the center of the slot electrode 200 increases. For example, if the distance from the center is twice, the size of each of the slits 212 and 214 is increased to about 1.2 to 2 times.

It should be noted that the shape of the slits 210 and their arrangement are not limited to that shown in FIGS. 7, 8, 9 and 10 as long as the density of the slits can be uniform over the surface of the slot electrode 200. That is, the configuration of the pair of slits 212 and 214 is not limited to the above-mentioned shape, and, for example, L-shaped slits may be used for the slot electrode 200. Additionally, the shape of each of the virtually divided areas is not limited to the hexagonal shape or the square shape, and an arbitrary shape such as a triangular shape may be adopted. Accordingly, the virtually divided areas may be different in their shape and size. Further, the slits 210 may be arranged along a plurality of concentric circles or a spiral although the density of the slits may not be uniform.

A radiation element having a width of a few millimeters may be provided on the periphery of the slot electrode 200 so as to prevent reflection of the microwave transmitted toward the periphery of the slot electrode 200. The radiation element provided for increasing an antenna efficiency of the slot electrode 200.

The temperature control plate 122 serves to control the temperature change of the antenna-accommodating member 123 and component parts near the antenna-accommodating member 123 to fall within a predetermined range. A temperature sensor and a heater unit (both not shown in the figure) are connected to the temperature control plate 122. The temperature control unit 121 controls a temperature of the temperature control plate 122 to be a predetermined temperature by introducing a cooling water or a coolant such as alcohol, gulden or flon into the temperature control plate 122. The temperature control plate 122 is made of a material such as stainless steel, which has high heat conductivity and can be machined to form a fluid passage for the cooling water therein.

The temperature control plate 122 contacts the antenna-accommodating member 123, and each of the antenna accommodating member 123 and the slow-wave member 124 has a high heat conductivity. Accordingly, the temperature of each of the slow-wave member 124 and the slot electrode 200 can be controlled by merely controlling the temperature of the temperature control plate 122. The temperature of each of the slow-wave member 124 and the slot electrode 200 is increased due to energy absorption when the microwave of the microwave generator 110 is supplied thereto for a long period of time. As a result, each of the slow-wave member 124 and the slot electrode 200 may deform due to thermal expansion.

For example, if the slot electrode 200 thermally deforms, the length of each slit is changed, which results in a decrease in the plasma density or localization of the plasma in the process chamber 102. The decrease in the plasma density may slow down a plasma processing speed such as an etching rate or a film deposition rate. As a result, if the plasma processing is controlled based on a processing time, there may be a case in which a desired result of the plasma processing (such as plasma etching depth or plasma deposition thickness) cannot be obtained when the plasma processing is applied for a predetermined time period (for example, two minutes), that is, for example, if the object W is processed for a predetermined time (for example, two minutes) and thereafter removed from the process chamber 102. Additionally, if the plasma density in the process chamber 102 is localized, the magnitude of plasma processing applied to the semiconductor wafer may vary. As mentioned above, if a deformation occurs in the slot electrode 200, the quality of plasma processing may deteriorate.

Further, if the temperature control plate 122 is not provided, the slot electrode 200 may warp since the materials of the slow-wave member 124 and the slot electrode 200 are different from each other and both members are fixed to each other by screws. In such a case, the quality of plasma processing may deteriorate for a reason similar to the above-mentioned reason.

A dielectric plate 230 is provided between the slot electrode 200 and the process chamber 102 so as to close the top opening of the process chamber 102. The slot electrode 200 is tightly joined to the surface of the dielectric plate 230 by brazing. Alternatively, the slot electrode 200 can be formed by a copper plate applied to the surface of the dielectric plate 230.

It should be noted that the function of the temperature control plate 122 may be provided to the dielectric plate 230. That is, the temperature of the dielectric plate 230 can be controlled by integrally forming a temperature control plate with the dielectric plate 230, which temperature control plate has a coolant passage near the side of the dielectric plate 230. By controlling the temperature of the dielectric plate 230, the temperature of the slow-wave member 124 and the slot electrode 200 can be controlled. The dielectric plate 230 is mounted to the process chamber 102 with an O-ring provided therebetween. Accordingly, the temperature of the dielectric plate 230 can be controlled by controlling a temperature of the O-ring, and, thereby controlling the temperature of the slow-wave member 124 and the slot electrode 200.

The dielectric plate 230 is made of a dielectric material such as aluminum nitride (AlN). The dielectric plate 230 prevents the slot electrode 200 from being deformed due to a negative pressure generated in the process chamber 102. Additionally, the dielectric plate 230 prevents the slot electrode 200 from being exposed to the atmosphere inside the process chamber 102 so that the environment inside the process chamber 102 is prevented from being contaminated by copper. If necessary, the dielectric plate 230 may be formed of a dielectric material having a low heat conductivity so as to prevent the slot electrode 200 from being influenced by heat from the process chamber 102.

In the present embodiment, the thickness of the dielectric plate 230 is greater than 0.5 times the wavelength of the microwave in the dielectric plate 230 and smaller than 0.75 times the wavelength of the microwave in the dielectric plate 230. Preferably, the thickness is in the range of 0.6 to 0.7 times the wavelength of the microwave in the dielectric plate 230. The 2.45 GHz microwave has a wavelength of about 122.5 mm in a vacuum. If the dielectric plate 230 is made of aluminum nitride (AlN), the wavelength reducing rate n is equal to 0.33 since the specific permittivity $\epsilon_r$ is about 9 as mentioned above. Accordingly, the wavelength of the microwave in the dielectric plate 230 is about 40.8 mm. Thus, if the dielectric plate 230 is formed of AlN, the thickness of the dielectric plate 230 is preferably greater than about 20.4 mm and smaller than about 30.6 mm, and, more preferably within a range from about 24.5 mm to about 28.6 mm. In general, the thickness H of the dielectric plate 230 preferably satisfies a relationship $0.5\lambda < H < 0.75\lambda$, and, more preferably, $0.6\lambda \leq H \leq 0.7\lambda$. The wavelength $\lambda$ of the microwave in the dielectric material 230 is represented by $\lambda = \lambda_0 n$, where $\lambda_0$ is a wavelength of the microwave in the vacuum and n is a wavelength reducing rate ($n = 1/\epsilon_r^{1/2}$).

Figure 11:
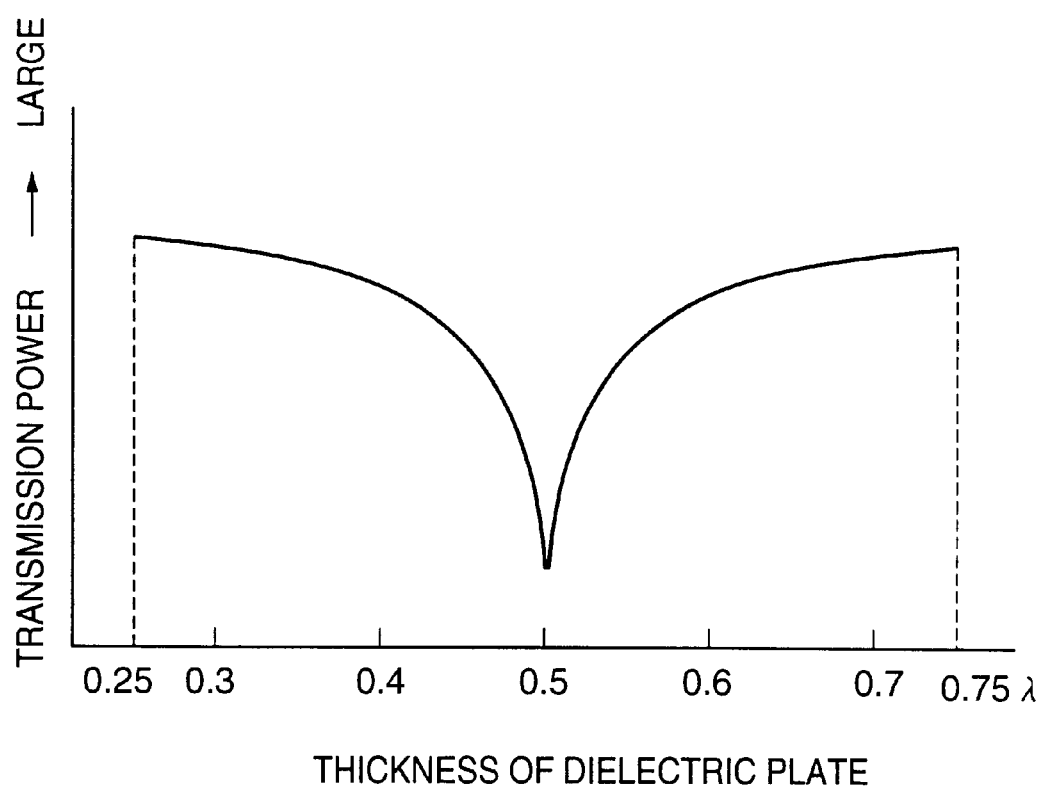
FIG. 11 is a graph showing a relationship between a transmission power of a microwave and a thickness of a dielectric plate.

When the thickness of the dielectric plate 230 is 0.5 times the wavelength of the microwave in the dielectric plate 230, a standing wave is generated as a resultant wave of a synthesis of a progressing wave traveling along the front surface of the dielectric plate 230 and a regressive wave reflected by the back surface of the dielectric plate 230. Thereby, the reflection is maximized and a power of the microwave transmitted to the process chamber 102 is minimized as shown in FIG. 11, which is a graph showing a relationship between a transmission power of the microwave and the thickness of the dielectric plate. In such a case, generation of plasma is insufficient, and, thereby a desired process speed cannot be achieved.

Figure 12:
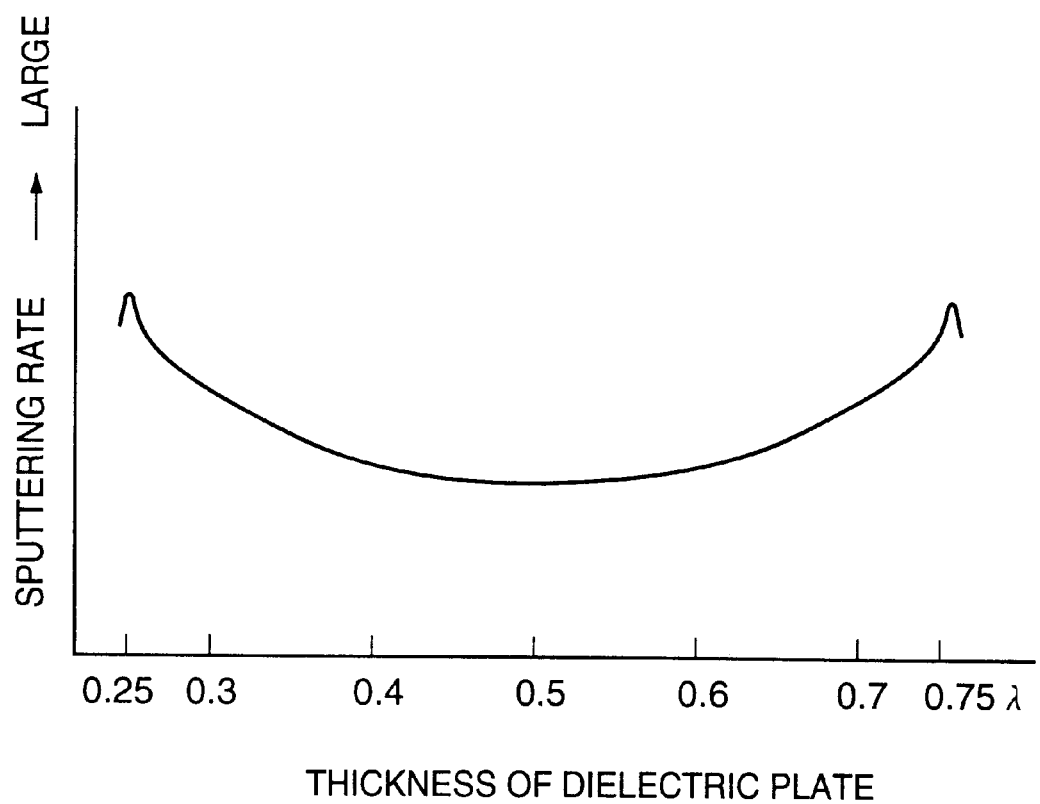
FIG. 12 is a graph showing a relationship between the thickness of the dielectric plate and an amount of isolation (sputtering rate) of the dielectric plate.

On the other hand, when thickness of the dielectric plate 230 is 0.75 times the wavelength of the microwave in the dielectric plate 230, the transmission power of the microwave is maximized but ion energy in the plasma is also maximized. The inventors found that a plasma ion energy applied by transmission of a microwave isolates the material of the dielectric plate 230 as shown in FIG. 12. FIG. 12 is a graph showing a relationship between the thickness of the dielectric plate 230 and an amount of isolation (sputtering rate) of the dielectric plate 230. If the material of the dielectric plate 230 isolates, the material enters the object W to be processed as impurities, thereby deteriorating a high-quality plasma process.

Figure 13:
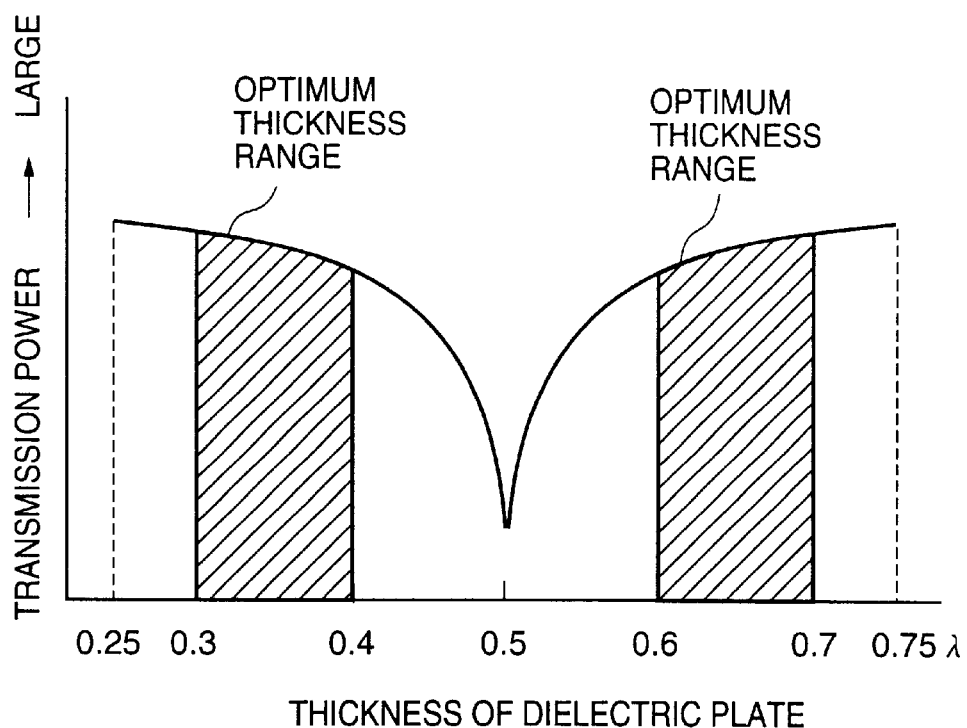
FIG. 13 is a graph shown in FIG. 11 with indication of ranges of the thickness of the dielectric plate.

Accordingly in the present embodiment, the thickness H of the dielectric plate 230 is set to a value ranging from $0.3\lambda$ to $0.4\lambda$ ($0.3\lambda \leq H \leq 0.4\lambda$) or a value ranging from $0.6\lambda$ to $0.7\lambda$ ($0.6\lambda \leq H \leq 0.7\lambda$) as shown in FIG. 13. The thickness H of the dielectric plates 230 may be set to a value ranging from $0.8\lambda$ to $0.9\lambda$ ($0.8\lambda \leq H \leq 0.9\lambda$) or a value ranging from $1.1\lambda$ to $1.2\lambda$ ($1.1\lambda \leq H \leq 1.2\lambda$) although the thickness H of the dielectric plates 230 is increased. In general form, the thickness H of the dielectric plate 230 is set to a value ranging from $(0.1+0.5\ N)\lambda$ to $(0.2+0.5\ N)\lambda$ or a value ranging from $(0.3+0.5\ N)\lambda$ to $(0.4+0.5\ N)\lambda$, where N is an integer. In other words, the thickness H of the dielectric plate 230 satisfies a relationship $(0.1+0.5\ N)\lambda \leq H \leq (0.2+0.5\ N)\lambda$ or $(0.3+0.5\ N)\lambda \leq H \leq (0.4+0.5\ N)\lambda$. Considering a mechanical strength of the dielectric plate 230, the thickness H of the dielectric plate 230 is preferably set to a value ranging from $0.6\ \lambda$ to $0.7\ \lambda$. However, for example, if the dielectric plate 230 is made of quartz having a specific permittivity of 3.8, a value ranging from $0.3\lambda$ to $0.4\ \lambda$ or a value ranging from $0.1\lambda$ to $0.2\lambda$ may be used. Additionally, the above-mentioned relationship in general form is applicable to a wave used for generating plasma other than a microwave.

Figure 14:
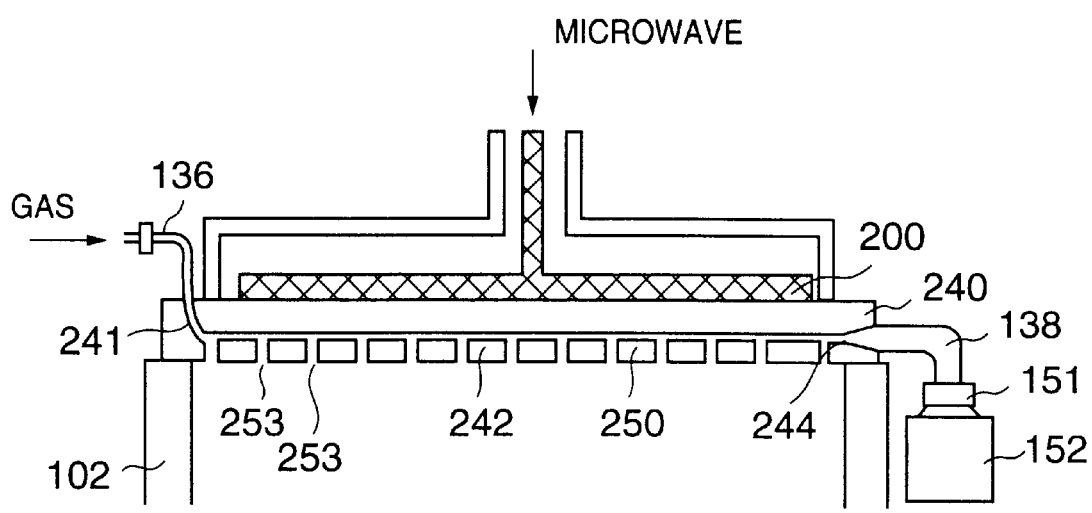
FIG. 14 is a cross-sectional view of a showerhead having a gas supply arrangement.

Since the gas supply systems 130 and 160 are arranged to supply a reactant gas and a discharge gas from the nozzles 143 and 173, respectively, the gasses may traverse the surface of the object W to be processed. Accordingly, a uniform the plasma density cannot be achieved even if the nozzles 143 and 173 are arranged in symmetric positions with respect to the center of the susceptor 104. In order to solve such a problem, it is considered to provide a showerhead structure made of glass above the susceptor 104. A description will be given, with reference to FIG. 14, of such a showerhead structure. FIG. 14 is an illustrative cross-sectional view of a showerhead having a gas supply arrangement.

The showerhead shown in FIG. 14 comprises a dielectric plate 240 and a shower plate 250. It should be noted that the dielectric plate 240 and the shower plate 250 may be integrally formed with each other by a dielectric material. The dielectric plate 240 is formed of an aluminum nitride (ALN) plate having a thickness of 30 mm. The shower plate 250 is attached to a bottom surface of the dielectric plate 240. The dielectric plate 240 has an inlet port 241, a gas passage 242 and an outlet port 244.

The gas supply passage 136 of the gas supply system 130 is connected to the inlet port of the dielectric plate 240. The gas exhaust passage 138 is connected to the outlet port 144 of the dielectric plate 240. Although the dielectric plate 240 shown in FIG. 14 is applied to the gas supply system 130, a mixture of the gasses supplied by the gas supply systems 130 and 160 may be supplied to the inlet port 141 of the dielectric plate 240. A plurality of the inlet ports 141 may be provided to the dielectric plate 241 so that a gas supplied through the inlet ports 241 is uniformly introduced into the process chamber through the showerhead. Additionally, a part of the inlet ports 241 may be connected to the gas supply passage 136, and the rest of the inlet ports 241 may be connected to the gas supply passage 166.

Alternatively, the gas supply system 160 may be provided to the sidewall of the process chamber as shown in FIG. 1. This is because the discharge gas such as argon is not easily decomposed as compared to silane or methane, and, thus, the uniformity of the plasma density is not so deteriorated if the discharge gas is introduced into the process chamber 102 from the side.

A shown in FIG. 14, the outlet port 144 of the dielectric plate 240 is connected to the gas exhaust passage 138, which is connected to the vacuum pump 152 via the pressure adjust valve 151. The function of the vacuum pump 151 is the same as that described above, and a description thereof will be omitted.

Figure 15:
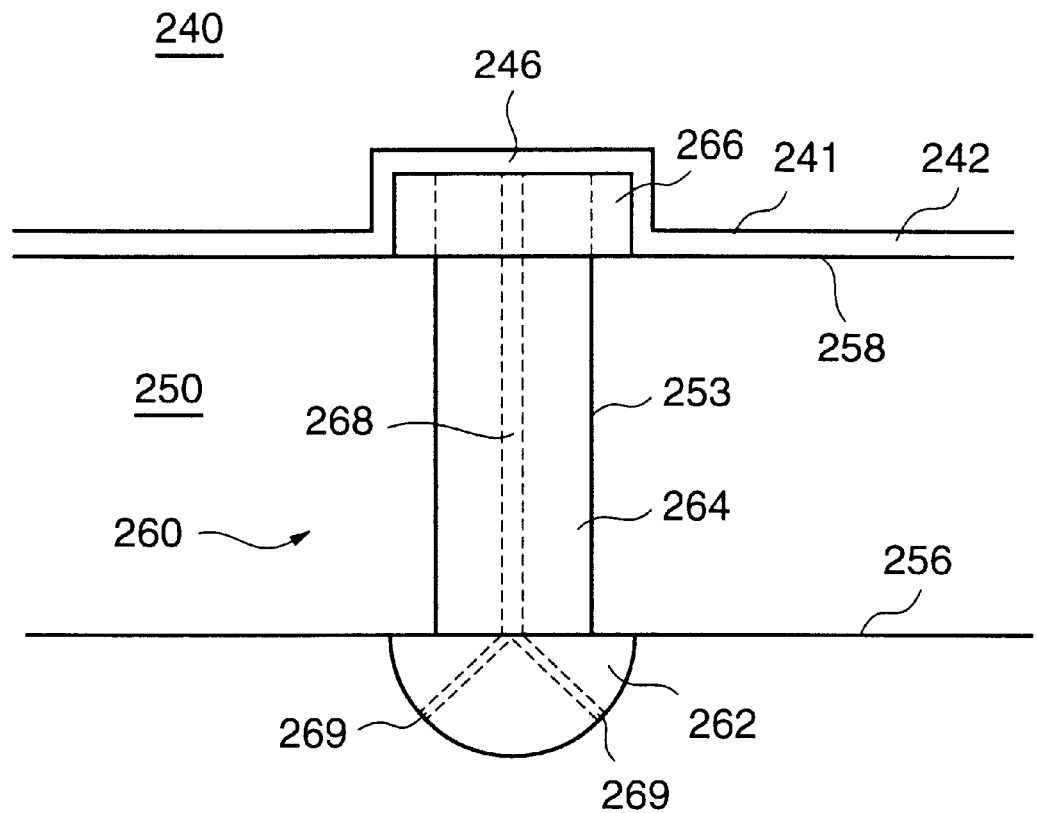
FIG. 15 is an enlarged cross-sectional view of a part of a shower plate which part includes one of nozzles provided to the shower plate.

A description will now be give, with reference to FIG. 15, of a structure of the shower plate 250 shown in FIG. 14. FIG. 15 is an enlarged cross-sectional view of a part of the shower plate 250 which part includes one of nozzles 253 provided to the shower plate 250. As shown in FIG. 15, the dielectric plate 240 has recessed portions 246 at positions corresponding to the nozzles 253 of the shower plate 250.

The shower plate 250 is made of an aluminum nitride (AlN) plate having a thickness of about 6 mm. The shower plate 250 has a plurality of nozzles 253 positioned in a predetermined uniform arrangement. As shown in FIG. 15, each of the nozzles 253 is provided with an eject member 260. The eject member 260 is constituted by a screw (262 and 264) and a nut 266.

The screw head 262 has a height of about 2 mm. A pair of eject passages 269 are formed in the screw head 262. Each of the eject passages 269 extends from the center of the screw head 262 in a direction inclined 45 degrees with respect to the bottom surface 256 of the shower plate 250. An end of each of the eject passages 269 is connected to a nozzle passage 268 formed in the screw part 254. Each of the eject passages 269 has a diameter of about 0.1 mm. The eject passages 269 are inclined so as to achieve a uniform introduction of the reaction gas. Accordingly, the number of the eject passages 269 and their angle with respect to the shower plate 250 may be changed so as to achieve uniform distribution of the reaction gas. It should be noted that, according to experiments conducted by the inventors, uniform distribution of the reaction gas was not achieved by a single ejecting passage extending in a direction perpendicular to the surface 256 of the shower plate 250. It was found that the eject passage 269 is preferably inclined so as to achieve uniform distribution of the reaction gas.

The nozzle passage 268 formed in the screw part 264 has a diameter of about 1 mm, and extends in a longitudinal direction of the screw part 264. An end of the nozzle passage 268 is open to a gap space 242 formed between the dielectric plate 240 and the shower plate 250. The screw part 264 is inserted into a through hole formed in the shower plate 250, and the screw is fastened to the shower plate 250 by the nut 266 being engaged with the end of the screw part 264. The nut 266 is accommodated in the recessed portion 246 formed on the surface of the dielectric plate 240 facing the shower plate 250.

The gap space 242 is provided for preventing generation of plasma. The thickness of the gap space 242 required for preventing generation of plasma varies according to a pressure of the reactant gas. That is, for example, the thickness of the gap space 242 is set to about 0.5 mm when the pressure is 10 Torr. In this case, the process space under the shower plate 250 in the process chamber 102 is set to a pressure of about 50 mTorr. The reactant gas is introduced into the process chamber 102 at a predetermined speed by controlling the pressure difference between the reactant gas and the atmosphere in the process chamber 102.

According to the shower plate 250 provided in the present embodiment, the reactant gas can be uniformly introduced and distributed in the process space in the process chamber 102 without generation of plasma before reaching the process space. An amount of flow of the reaction gas can be controlled according to the pressure difference between the gap space 242 and the process space in the process chamber 102, the number of eject passages 269, the inclination angle of the eject passages 269 and the size of each of the eject passages 269.

Figure 16:
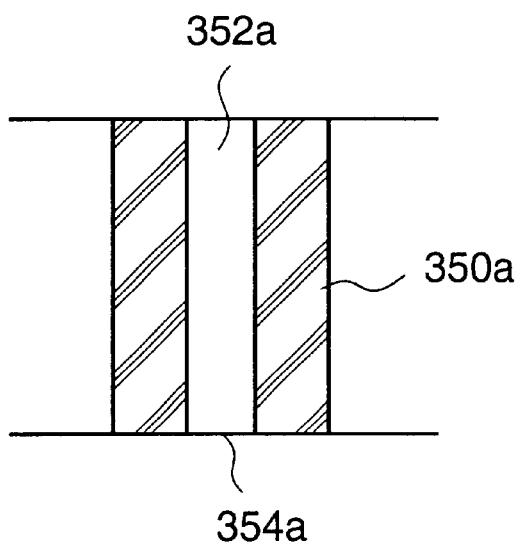
FIG. 16 is an enlarged cross-sectional view of an eject member provided with a nozzle passage having a single nozzle opening.
Figure 17:
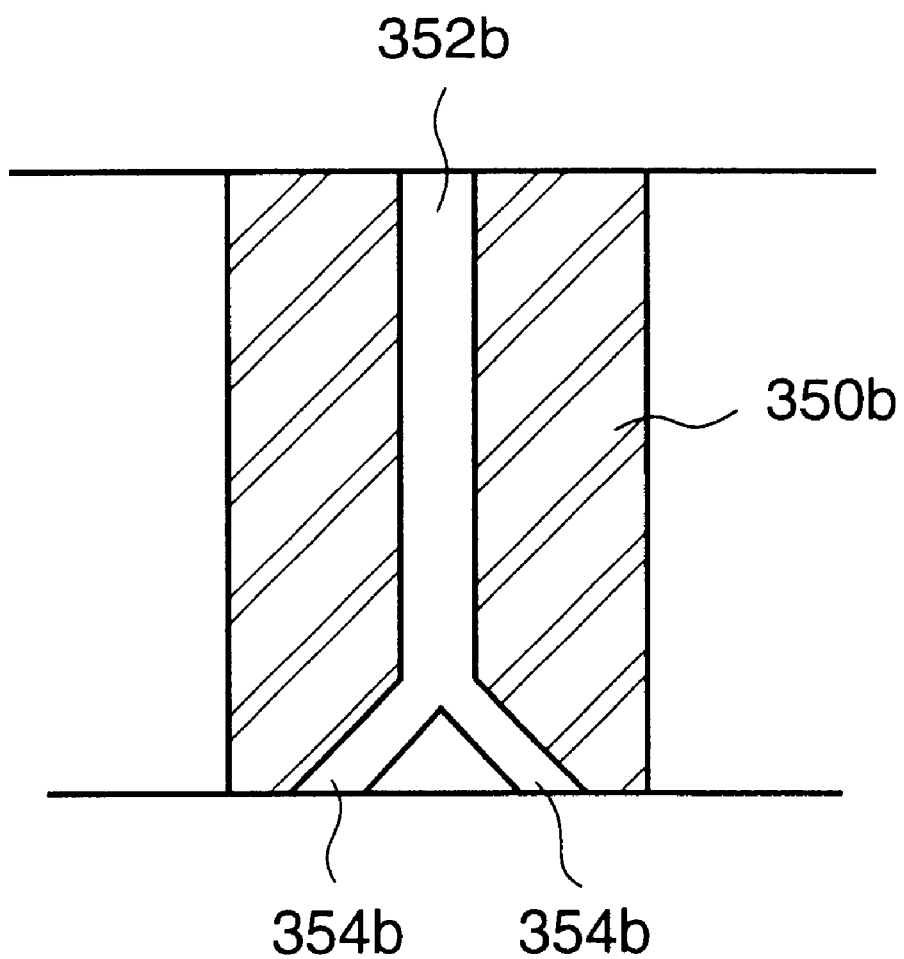
FIG. 17 is an enlarged cross-sectional view of an eject member provided with a nozzle passage having two nozzle openings.
Figure 18:
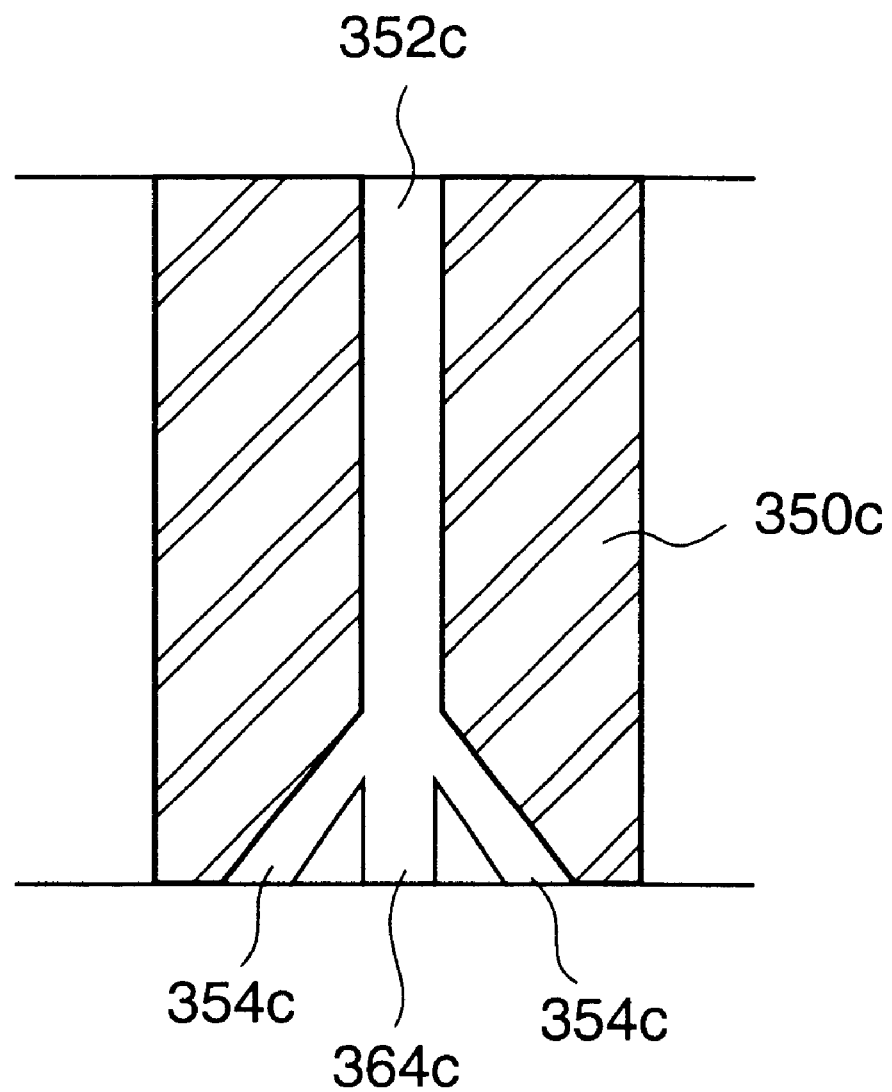
FIG. 18 is an enlarged cross-sectional view of an eject member provided with a nozzle passage having three nozzle openings.

The eject member 260 may be integrally formed with a part or a whole of the shower plate 250, and can be any shape. For example, the eject member 260 may be replaced by eject members shown in FIGS. 16, 17 and 18. FIG. 16 is an enlarged cross-sectional view of the eject member 350*a* provided with a nozzle passage 352*a* having a single nozzle opening 354*a*. FIG. 17 is an enlarged cross-sectional view of the eject member 350*b* provided with a nozzle passage 352*b* having two nozzle openings 354*b*. FIG. 18 is an enlarged cross-sectional view of the eject member 350*c* provided with a nozzle passage 352*c* having three nozzle openings 354*c*.

Figure 19:
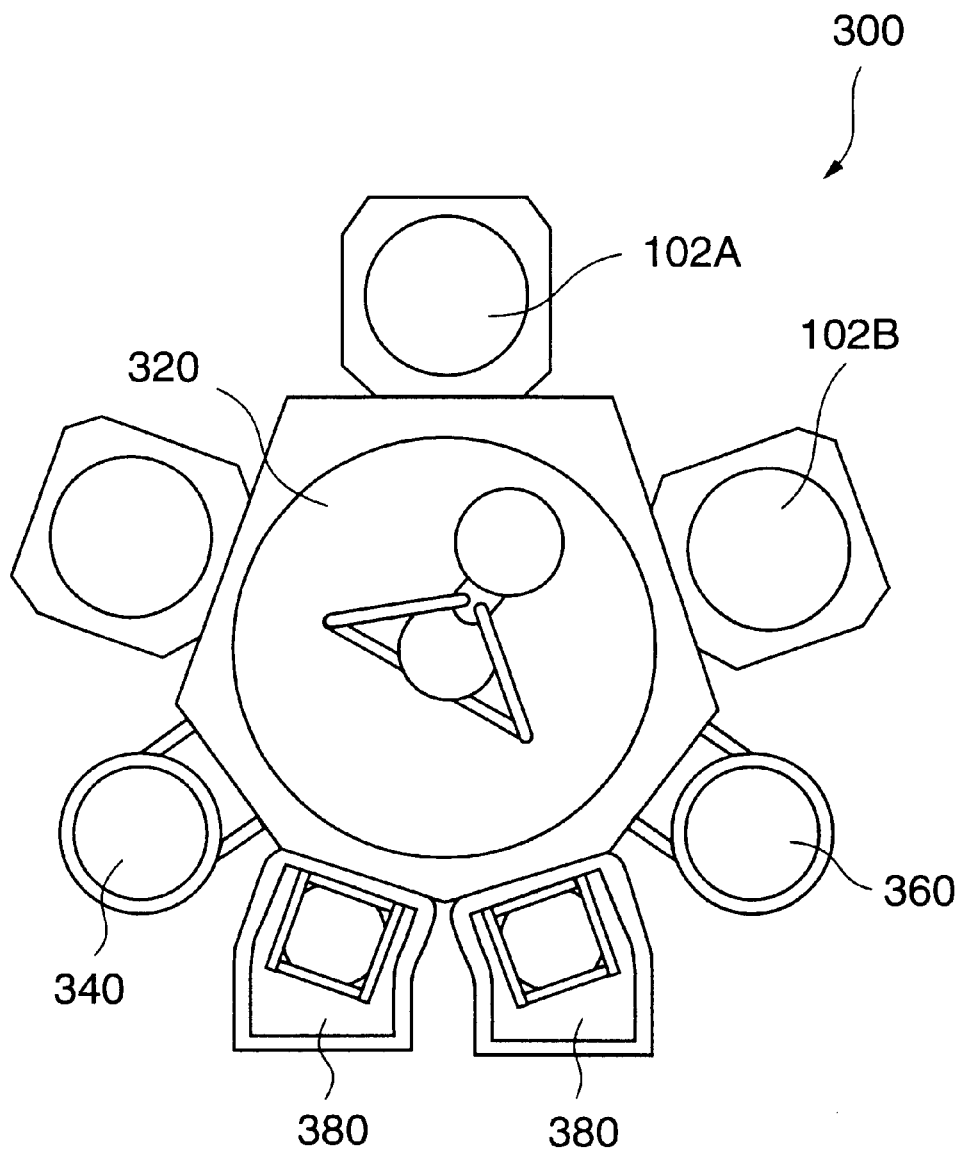
FIG. 19 is an illustrative plan view of a cluster tool, which is connectable to the microwave plasma processing apparatus shown in FIG. 1.

A description will now be given, with reference to FIG. 19, of a cluster tool that can be connected to the plasma processing apparatus 100 shown in FIG. 1. FIG. 19 is an illustrative plan view of the cluster tool 300 that is connectable to the microwave plasma processing apparatus 100 shown in FIG. 1. As mentioned above, the temperature of the object W can be controlled by the susceptor 104. However, in a CVD process, it takes a considerable time to raise the temperature of the object W from a room temperature to about 250° C. to 350° C. by the susceptor 104. In order to eliminate such a problem, the cluster tool 300 heats the object W prior to providing the object W to the process chamber 102 of the microwave plasma processing apparatus 100. Similarly, it takes a considerable time to decrease the temperature of the object W from 250° C. to 350° C. to a room temperature by the susceptor 104 after the plasma processing is completed. In order to eliminate such a problem, the cluster tool 300 cools the object W prior to starting another process after the object W is taken out of the process chamber 102 of the microwave plasma processing apparatus 100.

As illustratively shown in FIG. 19, the cluster tool 300 comprises: a conveyor section 320 including a conveyor arm which holds and conveys the object W to be processed; a preheating section 340 for heating the object W; a cooling section 360 for cooling the object W; and load-lock (L/L) chambers 380. In FIG. 19, two process chambers 102A and 102B are shown. Each of the process chambers 102A and 102B can be the process chamber 102 of the microwave plasma processing apparatus 100 shown in FIG. 1. The number of process chambers provided in the cluster tool 300 is not limited to two.

The conveyor section 320 is provided with the conveyor arm which holds the object W and a rotating mechanism for rotating the conveyor arm. The preheating section 340 is provided with a heater so as to heat the object W to a temperature close to a process temperature before the object W is placed in the process chamber 102A or 102B. The cooling section 340 is provided with a cooling chamber, which is cooled by a coolant so as to cool the object W taken out of the process chamber 102A or 102B to a room temperature before the object W is conveyed to a subsequent apparatus such as an ion implantation apparatus or an etching apparatus. Preferably, the cluster tool 300 comprises a rotational angle sensor, a temperature sensor, at least one control unit and a memory for storing control programs so as to control the rotation of the conveyor arm of the conveyor section 320 and control a temperature of each of the preheating section 340 and cooling section 360. Such a sensor, a control unit and a control program are known in the art, and descriptions thereof will be omitted. Additionally, the conveyor arm of the conveyor section 320 places the object W in the process chamber 102A or 102B through the gate valve 101.

A description will now be given of an operation of the microwave plasma processing apparatus 100 shown in FIG. 1. First, the conveyor arm of the conveyor section 320 shown in FIG. 19 holds the object W to be processed so as to place the object W in the process chamber 102 (in FIG. 19, one of the process chambers 102A and 102B corresponds to the process chamber 102). It is assumed that the object W is subjected to a CVD process in the process chamber 102. In such as case, the control unit (not shown in the figure) of the cluster tool 300 sends an instruction to the conveyor section 320 to convey the object W to the preheating section 340 so as to heat the object W to a temperature of about 300° C. before placing the object W in the process chamber 102.

For example, the cluster tool 300 forms a silicon oxidation film on a silicon substrate in the process chamber 102A by applying a plasma process. Thereafter the cluster tool 300 transfers the silicon substrate to the process chamber B so as to form a silicon nitride film by plasma processing the silicon oxidation film by introducing nitrogen into the process chamber 102B. A reactant gas introduced into the process chamber 102A so as to form the silicon oxidation film is typically $SiH_4$—$N_2O$. However, instead of $SiH_4$, TEOS (tetraethylorthosilicate), TMCTS (tetramethylcyclotetrasiloxane) or DADBS (diacetoxyditertiarybutoxysilane) may be used. The reactant gas introduced into the process chamber 102B is typically $SiH_4$—$NH_3$. However, instead of $SiH_4$, $SiF_6$, $NF_3$ or $SiF_4$ may be used.

Upon receiving the instruction, the conveyor section 320 moves the object W to the preheating section 340 so as to heat the object W. When the temperature sensor (not shown in the figure) of the cluster tool 300 detects that the object W to be processed is heated to a temperature of about 300° C., the control unit of the cluster tool 300 sends an instruction to the conveyor section 320 to move the object W to be processed from the preheating section 340 to the process chamber 102 through the gate valve 101. Accordingly, the conveyor arm of the conveyor section 320 conveys the heated object W to the process chamber 102 through the gate valve 101. When the heated object W reaches a position above the susceptor 104 in the process chamber 102, the lifter pin vertically moving system moves the lifter pins (not shown in the figure) so as to support the object W by the three lifter pins (not shown in the figure) protruding from the upper surface of the susceptor 104. After the object W is transferred from the conveyor arm to the lifter pins, the conveyor arm returns through the gate vale 101. Thereafter, the conveyor arm may be moved to a home position (not shown in the figure).

After the object W is transferred to the lifter pins, the vertical moving unit 146 moves the vertical moving member 142 downward so as to return the lifter pins inside the susceptor 104 and place the object W on the susceptor 104. At this time, a susceptor moving member can be moved while maintaining the hermetic seal of the process chamber 102 by a bellows (not shown in the figure). The susceptor 104 heats the object W placed thereon to a temperature of 300° C. At this time, since the object W is preheated, it takes a short time to completely the process preparation. More specifically, the heater control unit 191 controls the heater unit 198 so as to raise the temperature of the susceptor 104 to 300° C.

Thereafter, the high-vacuum pump 106 maintains the pressure in the process chamber 102 at 50 mTorr by being controlled by the pressure adjust valve. Additionally, the valves 151 and 153 are opened, and the vacuum pumps 152 and 154 evacuate gas form the gas supply rings 140 and 170. As a result, a water component remaining in the gas supply rings 140 and 170 is sufficiently removed therefrom.

Additionally, the susceptor vertically moving system moves the susceptor 104 and the object W to a predetermined process position from a home position. The bellows (not shown in the figure) maintains the negative pressure environment in the process chamber 102 during the vertically moving operation, and prevents an atmosphere from exiting outside the process chamber 102. Thereafter, the valves 151 and 153 are closed.

Thereafter, the valves 132 and 162 are opened so as to introduce a mixture of NH3, helium, nitrogen and hydrogen into the process chamber 102 from the gas supply rings 140 and 170 via the mass flow controllers 134 and 164. Since the valves 151 and 153 are closed, the vacuum pump 152 and 154 do not evacuate the gases in the gas supply systems 130 and 160 from being introduced into the process chamber 102.

When the shower plate 250 shown in FIG. 14 is used, the process chamber 102 is maintained, for example, at 50 mTorr, and a mixture of helium, nitrogen, hydrogen and $NH_3$, for example, is supplied to the dielectric plate 240. Thereafter, the mixture gas is introduced into the process chamber by being passed through the gap space 242, the recessed portions 246 and the nozzle passages 268 and 269 of the eject members 260. The mixture gas is not converted into plasma, and is introduced into the process chamber 102 with a high controllability of flow and a uniform density.

The temperature of the process space of the process chamber 102 is adjusted to be 300° C. A microwave is generated by the microwave generator 110, and is supplied to the wavelength-reducing member 124 of the antenna member 120 in a TEM mode via a square waveguide or a coaxial waveguide. The microwave passing through the wavelength-reducing member 124 is reduced in its wavelength, and enters the slot electrode 200. The microwave is then introduced into the process chamber 102 via the slits 210 and the dielectric material plate 230. Since a temperature of the wavelength reducing member 124 and the slot electrode 200 is controlled, there is no deformation due to thermal expansion. Accordingly, an optimum length of the slits 210 can be maintained. Thus, the microwave can be introduced into the process chamber 102 at a desired density without local concentration.

Thereafter, the reactant gas in the process chamber 102 is converted into plasma by the microwave, and a plasma CVD process is performed on the object W placed on the susceptor 104. If the baffle plate 194 is used, the baffle plate maintains the potential in the process space so as to prevent the microwave from exiting the process space. Thus, a desired process speed can be maintained.

If a temperature of the susceptor 104 is raised higher than a predetermined upper limit temperature due to continuous use, the susceptor 104 is cooled by the temperature control unit 191. On the other hand, if the temperature of the susceptor 104 is below a predetermined lower limit temperature at an initial stage of the operation of the apparatus or when the susceptor 104 is over cooled, the temperature control unit 191 heats the susceptor 104.

The plasma CVD process is continued for a predetermined period of time (for example, about 2 minutes). Thereafter, the object W is taken out of the process chamber 102 through the gate valve 101 by the conveyor section 320 of the cluster tool 300 in a reversed way of the above-mentioned procedure. When the susceptor 104 is taken out, the vertically moving mechanism (not shown in the figure) returns the susceptor 104 and the object W to the home position. The predetermined process time of 2 minutes is determined by a CVD processing time generally required for forming the layered nitride film. That is, even if the temperature control unit 190 sets the temperature to about 250°

C. to 350° C., a long time deposition process may cause a problem similar to when the temperature is set higher than 350° C. Additionally, if the process time is too short, there may be a case in which a semiconductor element produced from the object W cannot effectively prevent a leak current.

Since the microwave is uniformly supplied to the process chamber 102 with a predetermined density, a silicon oxidation film and a silicon nitride film having a desired thickness are formed on the object W to be processed. Additionally, since the temperature of the process chamber 102 is maintained in the predetermined range so that a water component (impurities) does not enter the object W, the deposited film can be maintained at a desired quality. The object W taken out of the process chamber 102 is transferred to the cooling section 360 and the object W is cooled to a room temperature in a short time. Then, if necessary, the object W is conveyed by the conveyor section 320 to a next stage apparatus such as an ion implantation apparatus.

In the present embodiment, the gas supply system 130 or 160 may be arranged to use the dielectric plate 240 and the shower plate 250 as shown in FIG. 14. In such a case, the outlet port 244 of the dielectric pate is connected to the bypass passage 182 or 184 so that the gas passage 242 is connected to the vacuum pump 6 by bypassing the process chamber 102.

It should be noted that the microwave plasma processing apparatuses 100 can utilize an electron cyclotron resonance, and therefore, an electromagnetic coil may be provided so as to generate a magnetic field in the process chamber 102. Additionally, although the microwave plasma processing apparatus 100 according to the present embodiment performs the plasma CVD process as plasma processing, the plasma processing is not limited to the plasma CVD process. That is, for example, a plasma etching process or a plasma cleaning process may be performed by the microwave plasma processing apparatus 100. Additionally, the present invention is not limited to the RLSA type plasma processing apparatus, and may be applied to a parallel plate plasma processing apparatus utilizing a grow discharge. Further, the object W to be processed by the microwave plasma processing apparatus 100 is not limited to the wafer for producing a semiconductor device, and the microwave plasma processing apparatus 100 may be used to process an LCD substrate or a glass substrate.

The present invention is not limited to the specifically disclosed embodiments, and variations and modifications may be made without departing from the scope of the present invention.

The present application is based on Japanese priority application No. 2000-085264 filed on Mar. 24, 2000, the entire contents of which are hereby incorporated by reference.

What is claimed is:

1. A dielectric plate adapted to be provided between a process chamber of a plasma processing apparatus and a slot electrode guiding a microwave used for a plasma process, wherein a thickness H of said dielectric plate has a predetermined relationship with a wavelength $\lambda$ of the microwave in said dielectric plate so that an amount of isolation of said dielectric plate due to transmission of the microwave is minimized, the wavelength $\lambda$ being represented by $\lambda=\lambda_0 n$, where $\lambda_0$ is a wavelength of the microwave in a vacuum and n is a wavelength reducing rate of said dielectric plate represented by $n=1/(\epsilon_r)^{1/2}$, where $\epsilon_r$ is a specific dielectric rate of said dielectric plate in a vacuum.

2. The dielectric plate as claimed in claim 1, wherein the predetermined relationship between the thickness H and the wavelength $\lambda$ of said dielectric plate is represented by $0.5\lambda<H<0.75\lambda$.

3. The dielectric plate as claimed in claim 2, wherein the thickness H of said dielectric plate satisfies a relationship represented by $0.6\lambda\leq H\leq 0.7\lambda$.

4. The dielectric plate as claimed in claim 1, wherein the predetermined relationship between the thickness H and the wavelength $\lambda$ of said dielectric plate is represented by $0.3\lambda<H<0.4\lambda$.

5. The dielectric plate as claimed in claim 1, wherein the predetermined relationship between the thickness H and the wavelength $\lambda$ of said dielectric plate is represented by one of the relationships $(0.1+0.5\,N)\lambda\leq H\leq(0.2+0.5\,N)\lambda$ and $(0.3+0.5\,N)\lambda\leq H\leq(0.4+0.5\,N)\lambda$, where N is an integer.

6. A plasma processing apparatus comprising:

a process chamber in which a plasma process is applied to an object to be processed;

a slot electrode having a plurality of slits guiding a microwave introduced into said process chamber so as to generate plasma in said process chamber; and a dielectric plate provided between said slot electrode and said process chamber, wherein a thickness H of said dielectric plate has a predetermined relationship with a wavelength $\lambda$ of the microwave in said dielectric plate so that an amount of isolation of said dielectric plate due to transmission of the microwave is minimized, the wavelength $\lambda$ being represented by $\lambda=\lambda_0 n$, where $\lambda_0$ is a wavelength of the microwave in a vacuum and n is a wavelength reducing rate of said dielectric plate represented by $n=1/(\epsilon_r)^{1/2}$, where $\epsilon_r$ is a specific dielectric rate of said dielectric plate in a vacuum.

7. The plasma processing apparatus as claimed in claim 6, wherein the predetermined relationship between the thickness H and the wavelength $\lambda$ of said dielectric plate is represented by $0.5\lambda<H<0.75\lambda$.

8. The plasma processing apparatus as claimed in claim 7, wherein the thickness H of said dielectric plate satisfies a relationship represented by $0.6\lambda\leq H\leq 0.7\lambda$.

9. The plasma processing apparatus as claimed in claim 6, wherein the predetermined relationship between the thickness H and the wavelength $\lambda$ of said dielectric plate is represented by $0.3\,\lambda<H<0.4\lambda$.

10. The plasma processing apparatus as claimed in claim 6, wherein the predetermined relationship between the thickness H and the wavelength $\lambda$ of said dielectric plate is represented by one of the relationships $(0.1+0.5\,N)\lambda\leq H\leq(0.2+0.5\,N)\lambda$ and $(0.3+0.5\,N)\lambda\leq H\leq(0.4+0.5\,N)\lambda$, where N is an integer.

* * * * *